United States Patent
Baheti et al.

(10) Patent No.: US 9,136,980 B2
(45) Date of Patent: Sep. 15, 2015

(54) METHOD AND APPARATUS FOR LOW COMPLEXITY COMPRESSION OF SIGNALS

(75) Inventors: Pawan Kumar Baheti, San Diego, CA (US); Harinath Garudadri, San Diego, CA (US); Yuejie Chi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 829 days.

(21) Appl. No.: 13/221,633

(22) Filed: Aug. 30, 2011

(65) Prior Publication Data

US 2012/0224611 A1 Sep. 6, 2012

Related U.S. Application Data

(60) Provisional application No. 61/381,692, filed on Sep. 10, 2010.

(51) Int. Cl.
*G10L 19/00* (2013.01)
*G10L 21/00* (2013.01)
*H04L 1/00* (2006.01)
*H03M 7/30* (2006.01)
*H04L 1/22* (2006.01)

(52) U.S. Cl.
CPC ............ *H04L 1/0043* (2013.01); *H03M 7/30* (2013.01); *H04L 1/0052* (2013.01); *H04L 1/22* (2013.01)

(58) Field of Classification Search
USPC .................................. 704/200–230, 500–504
See application file for complete search history.

(56) References Cited

U.S. PATENT DOCUMENTS

| | | | |
|---|---|---|---|
| 5,092,341 A | 3/1992 | Kelen | |
| 5,355,430 A | 10/1994 | Huff | |
| 5,774,844 A * | 6/1998 | Akagiri | 704/230 |
| 5,886,276 A | 3/1999 | Levine et al. | |
| 6,098,039 A * | 8/2000 | Nishida | 704/229 |
| 6,449,596 B1 * | 9/2002 | Ejima | 704/501 |
| 6,658,382 B1 * | 12/2003 | Iwakami et al. | 704/224 |
| 7,020,615 B2 | 3/2006 | Vafin et al. | |
| 7,272,556 B1 * | 9/2007 | Aguilar et al. | 704/230 |

(Continued)

FOREIGN PATENT DOCUMENTS

| CN | 1071769 A | 5/1993 |
|---|---|---|
| JP | S58223927 A | 12/1983 |

(Continued)

OTHER PUBLICATIONS

Venkatraman et al. "A compressive sensing approach to object-based surveillance video coding". IEEE International Conference on Acoustics, Speech, and Signal Processing, Apr. 2009, pp. 3513-3516.*

(Continued)

*Primary Examiner* — Jesse Pullias
(74) *Attorney, Agent, or Firm* — Paul S. Holdaway

(57) ABSTRACT

Certain aspects of the present disclosure relate to techniques for low-complexity encoding (compression) of broad class of signals, which are typically not well modeled as sparse signals in either time-domain or frequency-domain. First, the signal can be split in time-segments that may be either sparse in time domain or sparse in frequency domain, for example by using absolute second order differential operator on the input signal. Next, different encoding strategies can be applied for each of these time-segments depending in which domain the sparsity is present.

35 Claims, 14 Drawing Sheets

(56) References Cited

U.S. PATENT DOCUMENTS

| | | | |
|---|---|---|---|
| 2009/0106030 | A1 | 4/2009 | Den Brinker et al. |
| 2010/0246651 | A1 | 9/2010 | Baheti et al. |
| 2010/0262420 | A1 | 10/2010 | Herre et al. |
| 2011/0066381 | A1 | 3/2011 | Garudadri et al. |
| 2012/0005248 | A1 | 1/2012 | Garudadri et al. |
| 2015/0006598 | A1 | 1/2015 | Garudadri et al. |

FOREIGN PATENT DOCUMENTS

| | | | |
|---|---|---|---|
| JP | S59216282 | A | 12/1984 |
| JP | H06209909 | A | 8/1994 |
| JP | H06339470 | A | 12/1994 |
| JP | H10161633 | A | 6/1998 |
| JP | H11145846 | A | 5/1999 |
| JP | 2000106529 | A | 4/2000 |
| JP | 2001136073 | A | 5/2001 |
| JP | 2002010987 | A | 1/2002 |
| JP | 2007318287 | A | 12/2007 |
| JP | 4196775 | B2 | 12/2008 |
| WO | 0019414 | A1 | 4/2000 |
| WO | 2011116018 | A1 | 9/2011 |

OTHER PUBLICATIONS

Benzid, et al., "Fixed Percentage of Wavelet Coefficients to Be Zeroed for ECG Compression," in Electron. Lett., vol. 39, No. 11 (2003), pp. 830-831.

Candes E, "Compressive Sampling: Sense-less but Smart", Thesis Feb. 1, 2007, pp. 1-35, XP007905383, the whole document.

Gleichman, et al., "Blind Compress Sensing," arXiv:1002.2586v2 [cs.IT], Apr. 28, 2010, pp. 1-17.

Hao et al., "Compression of ECG as a Signal with Finite Rate of Innovation", Proceedings of the 2005 IEEE Engineering in Medicine and Biology 27th Annual Conference, Shanghai, China, Sep. 1-4, 2005.

Mohammadpour, et al., "ECG Compression with Thresholding of 2-D Wavelet Transform Coefficients and Run Length Coding," in European Journal of Scientific Research, vol. 27 No. 2 (2009), pp. 248-257.

Poh et al., "Compressive Sampling of EEG Signals with Finite Rate of Innovation", Hindawi Publishing Corp., EIRASIP Journal on Advances in Signal Processing, vol. 2010, Article ID 183105, 12 pages, 2010.

The Sampling Theorem,Signal Reconstruction, Jul. 2002, XP002649306, Retrieved from the Internet: URL:http://www.st-andrews.ac.uk/www_pa/Scots_Guide/iandm/part7/page3.html.

Divya Venkatraman, et al., "A compressive sensing approach to object -based surveillance video coding", Acoustics, Speech and Signal Processing, 2009. ICASSP 2009. IEEE International Conference on, IEEE, Piscataway, NJ, USA, Apr. 19, 2009, pp. 3513-3516, XP031460029, ISBN: 978-1-4244-2353-8.

Gemmeke J. F., et al., "Compressive Sensing for Missing Data Imputation in Noise Robust Speech Recognition", IEEE Journal of Selected Topics in Signal Processing, IEEE, US, vol. 4, No. 2, Apr. 1, 2010, pp. 272-287, XP011327594, ISSN: 1932-4553, DOI: 10.1109/JSTSP.2009.2039171.

International Search Report and Written Opinion—PCT/US2011/050980—ISA/EPO—Dec. 22, 2011.

Ruizhen Zhao, et al., "Signal pre-processing method suitable for compressive sensing based on frequency modulation", Signal Processing (ICSP), 2010 IEEE 10th International Conference on, IEEE, Piscataway, NJ, USA, Oct. 24, 2010, pp. 62-65, XP031817362, ISBN: 978-1-4244-5897-4.

Kulkarni S R "Sampling and Quantization", ELE 201 Introduction to Electrical Signals and Systems, 2002, Chapter-5, pp. 1-16.

\* cited by examiner

METHOD AND APPARATUS FOR LOW COMPLEXITY COMPRESSION OF SIGNALS

CLAIM OF PRIORITY UNDER 35 U.S.C. §119

The present Application for patent claims benefit of U.S. Provisional Patent Application Ser. No. 61/381,692, entitled, "Method and apparatus for processing and reconstructing data", filed Sep. 10, 2010 and assigned to the assignee hereof and hereby expressly incorporated by reference herein.

BACKGROUND

1. Field

Certain aspects of the present disclosure generally relate to communication and, more particularly, to a method and apparatus for low complexity compression of signals and its reconstruction.

2. Background

In a Body Area Network (BAN), designing of low complexity encoders can be desired due to the power constraint at each sensor of the BAN, and pushing the computational load to receivers. Biomedical signals like Electro Cardiogram (ECG) signal and motion data are typically not well modeled as sparse signals in either time-domain or frequency-domain due to spike-like short-time components. Thus, a low-complexity encoder compression strategy may be required for broader classes of signals. In BAN context, depending on the radio characteristics (i.e., energy/bit and reliability), it may be required to take into account the sensor encoding strategies—implying that it may be required to consider compression efficiency and desired level of redundancy against channel errors.

SUMMARY

Certain aspects of the present disclosure provide an apparatus for communication. The apparatus generally includes a first circuit configured to detect one or more transient segments of a signal, a second circuit configured to estimate a residual segment of the signal based on the one or more transient segments, a first encoder configured to encode the one or more transient segments, a second encoder configured to encode the residual segment, and a transmitter configured to transmit the one or more encoded transient segments and the encoded residual segment.

Certain aspects of the present disclosure provide a method for communication. The method generally includes detecting one or more transient segments of a signal, estimating a residual segment of the signal based on the one or more transient segments, encoding the one or more transient segments, encoding the residual segment, and transmitting the one or more encoded transient segments and the encoded residual segment.

Certain aspects of the present disclosure provide an apparatus for communication. The apparatus generally includes means for detecting one or more transient segments of a signal, means for estimating a residual segment of the signal based on the one or more transient segments, means for encoding the one or more transient segments, means for encoding the residual segment, and means for transmitting the one or more encoded transient segments and the encoded residual segment.

Certain aspects of the present disclosure provide a computer-program product for communication. The computer-program product includes a computer-readable medium comprising instructions executable to detect one or more transient segments of a signal, estimate a residual segment of the signal based on the one or more transient segments, encode the one or more transient segments, encode the residual segment, and transmit the one or more encoded transient segments and the encoded residual segment.

Certain aspects of the present disclosure provide a sensing device. The sensing device generally includes a sensor configured to sense a signal, a first circuit configured to detect one or more transient segments of the signal, a second circuit configured to estimate a residual segment of the signal based on the one or more transient segments, a first encoder configured to encode the one or more transient segments, a second encoder configured to encode the residual segment, and a transmitter configured to transmit the one or more encoded transient segments and the encoded residual segment.

Certain aspects of the present disclosure provide an apparatus for communication. The apparatus generally includes a receiver configured to receive a signal with a first set of samples corresponding to one or more transient segments of the signal and with a second set of samples corresponding to one or more band-limited segments of the signal, and a first circuit configured to reconstruct a version of the signal transmitted from another apparatus based at least in part on the first set of samples and the second set of samples.

Certain aspects of the present disclosure provide a method for communication. The method generally includes receiving a signal with a first set of samples corresponding to one or more transient segments of the signal and with a second set of samples corresponding to one or more band-limited segments of the signal, and reconstructing a version of the signal transmitted from an apparatus based at least in part on the first set of samples and the second set of samples.

Certain aspects of the present disclosure provide an apparatus for communication. The apparatus generally includes means for receiving a signal with a first set of samples corresponding to one or more transient segments of the signal and with a second set of samples corresponding to one or more band-limited segments of the signal, and means for reconstructing a version of the signal transmitted from another apparatus based at least in part on the first set of samples and the second set of samples.

Certain aspects of the present disclosure provide a computer-program product for communication. The computer-program product includes a computer-readable medium comprising instructions executable to receive a signal with a first set of samples corresponding to one or more transient segments of the signal and with a second set of samples corresponding to one or more band-limited segments of the signal, and reconstruct a version of the signal transmitted from an apparatus based at least in part on the first set of samples and the second set of samples.

Certain aspects of the present disclosure provide a headset. The headset generally includes a receiver configured to receive, from a sensing device over a channel, a signal with a first set of samples corresponding to one or more transient segments of the signal and with a second set of samples corresponding to one or more band-limited segments of the signal, a first circuit configured to reconstruct a version of the signal transmitted from the sensing device based at least in part on the first set of samples and the second set of samples, and a transducer configured to provide an audio output based on the reconstructed version of signal.

Certain aspects of the present disclosure provide a watch. The watch generally includes a receiver configured to receive, from a sensing device over a channel, a signal with a first set of samples corresponding to one or more transient segments of the signal and with a second set of samples corresponding to one or more band-limited segments of the signal, a first circuit configured to reconstruct a version of the signal transmitted from the sensing device based at least in part on the first set of samples and the second set of samples, and a user interface configured to provide an indication based on the reconstructed version of signal.

Certain aspects of the present disclosure provide a monitoring device. The monitoring device generally includes a connector, a receiver configured to receive, from a sensing device via the connector, a signal with a first set of samples corresponding to one or more transient segments of the signal and with a second set of samples corresponding to one or more band-limited segments of the signal, a first circuit configured to reconstruct a version of the signal transmitted from the sensing device based at least in part on the first set of samples and the second set of samples, and a user interface configured to provide an indication based on the reconstructed version of signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
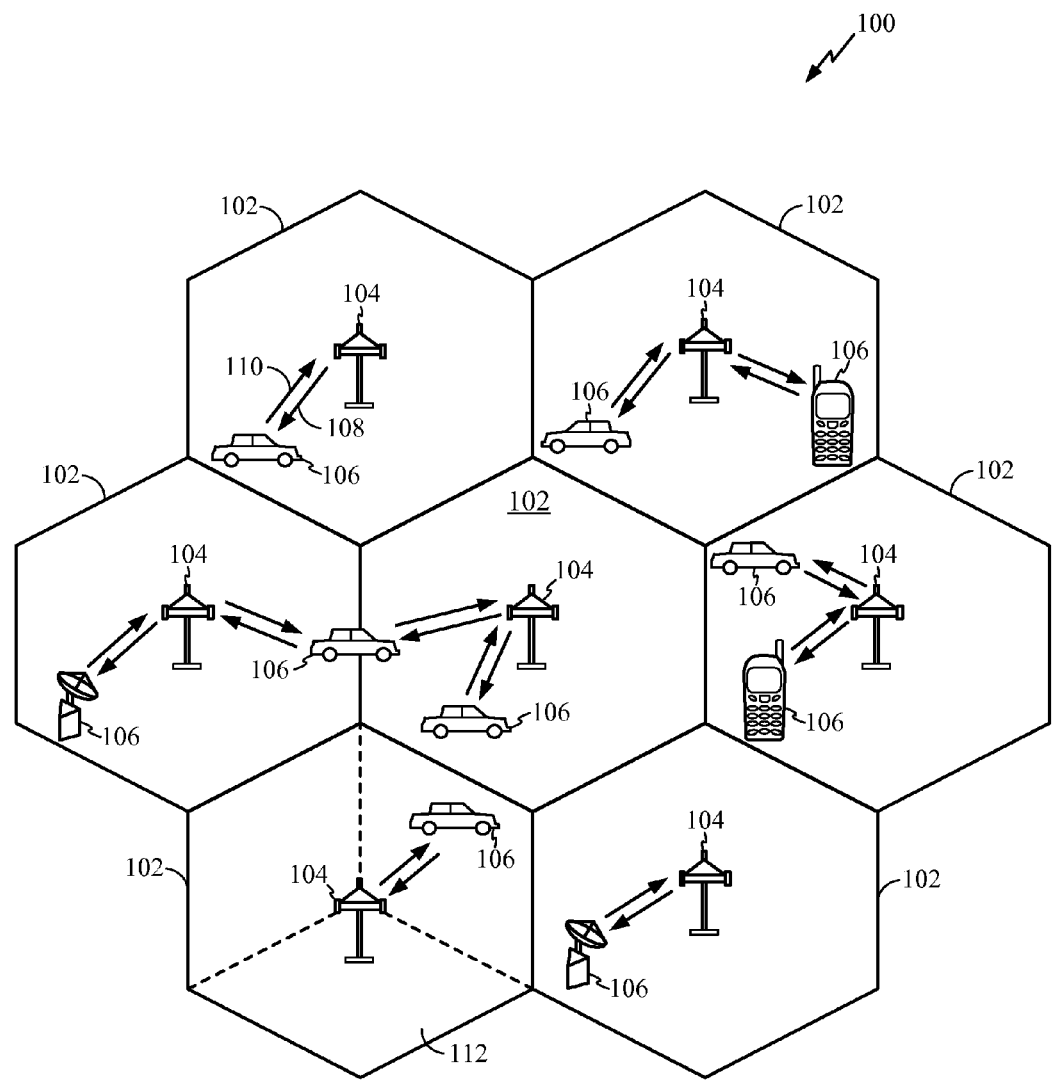
FIG. 1 illustrates an example wireless communication system in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Wireless Communication System

The techniques described herein may be used for various broadband wireless communication systems, including communication systems that are based on an orthogonal multiplexing scheme and a single carrier transmission. Examples of such communication systems include Orthogonal Frequency Division Multiple Access (OFDMA) systems, Single-Carrier Frequency Division Multiple Access (SC-FDMA)

systems, Code Division Multiple Access (CDMA), and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA. A CDMA system may utilize spread-spectrum technology and a coding scheme where each transmitter (i.e., user) is assigned a code in order to allow multiple users to be multiplexed over the same physical channel.

The teachings herein may be incorporated into (e.g., implemented within or performed by) a variety of wired or wireless apparatuses (e.g., nodes). In some aspects a node comprises a wireless node. Such wireless node may provide, for example, connectivity for or to a network (e.g., a wide area network such as the Internet or a cellular network) via a wired or wireless communication link. In some aspects, a wireless node implemented in accordance with the teachings herein may comprise an access point or an access terminal.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology. In some implementations an access point may comprise a set top box kiosk, a media center, or any other suitable device that is configured to communicate via a wireless or wired medium.

An access terminal ("AT") may comprise, be implemented as, or known as an access terminal, a subscriber station, a subscriber unit, a mobile station, a remote station, a remote terminal, a user terminal, a user agent, a user device, user equipment, a user station, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), a tablet, an entertainment device (e.g., a music or video device, or a satellite radio), a television display, a flip-cam, a security video camera, a digital video recorder (DVR), a global positioning system device, or any other suitable device that is configured to communicate via a wireless or wired medium.

FIG. 1 illustrates an example of a wireless communication system 100 in which aspects of the present disclosure may be employed. The wireless communication system 100 may be a broadband wireless communication system. The wireless communication system 100 may provide communication for a number of cells 102, each of which is serviced by a base station 104. A base station 104 may be a fixed station that communicates with user terminals 106. The base station 104 may alternatively be referred to as an access point, a Node B or some other terminology.

FIG. 1 depicts various user terminals 106 dispersed throughout the system 100. The user terminals 106 may be fixed (i.e., stationary) or mobile. The user terminals 106 may alternatively be referred to as remote stations, access terminals, terminals, subscriber units, mobile stations, stations, user equipment, etc. The user terminals 106 may be wireless devices, such as cellular phones, personal digital assistants (PDAs), handheld devices, headsets, wireless modems, laptop computers, personal computers, etc.

A variety of processes and methods may be used for transmissions in the wireless communication system 100 between the base stations 104 and the user terminals 106. For example, signals may be sent and received between the base stations 104 and the user terminals 106 in accordance with OFDM/OFDMA techniques. If this is the case, the wireless communication system 100 may be referred to as an OFDM/OFDMA system. Alternatively, signals may be sent and received between the base stations 104 and the user terminals 106 in accordance with CDMA techniques. If this is the case, the wireless communication system 100 may be referred to as a CDMA system.

A communication link that facilitates transmission from a base station 104 to a user terminal 106 may be referred to as a downlink (DL) 108, and a communication link that facilitates transmission from a user terminal 106 to a base station 104 may be referred to as an uplink (UL) 110. Alternatively, a downlink 108 may be referred to as a forward link or a forward channel, and an uplink 110 may be referred to as a reverse link or a reverse channel.

A cell 102 may be divided into multiple sectors 112. A sector 112 is a physical coverage area within a cell 102. Base stations 104 within a wireless communication system 100 may utilize antennas that concentrate the flow of power within a particular sector 112 of the cell 102. Such antennas may be referred to as directional antennas.

Figure 2:
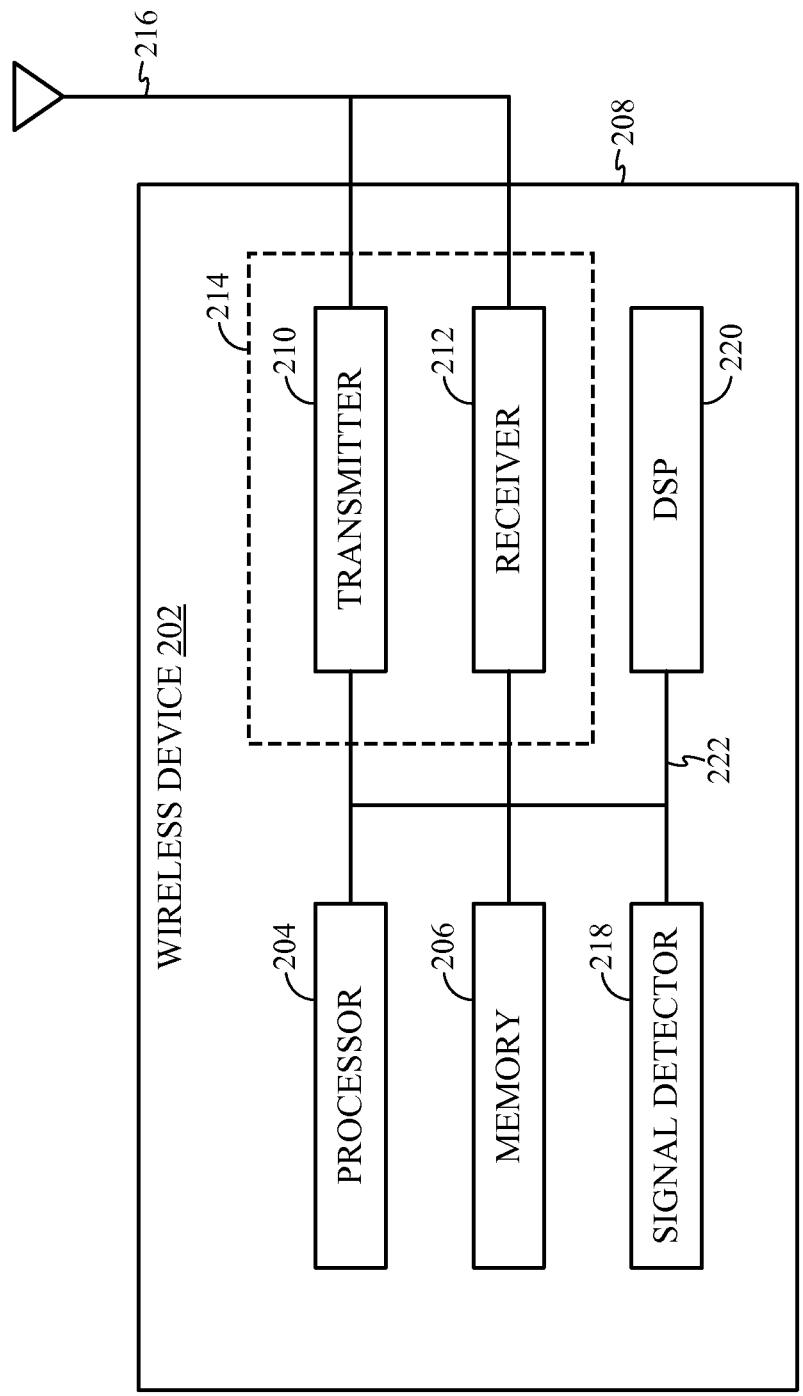
FIG. 2 illustrates various components that may be utilized in a wireless device in accordance with certain aspects of the present disclosure.

FIG. 2 illustrates various components that may be utilized in a wireless device 202 that may be employed within the wireless communication system 100. The wireless device 202 is an example of a device that may be configured to implement the various methods described herein. The wireless device 202 may be a base station 104 or a user terminal 106.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The processor 204 may comprise or be a component of a processing system implemented with one or more processors. The one or more processors may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processing system may also include machine-readable media for storing software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing system to perform the various functions described herein.

The wireless device 202 may also include a housing 208 that may include a transmitter 210 and a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The wireless device 202 may also include a signal detector 218 that may be used in an effort to detect and quantify the level of signals received by the transceiver 214. The signal detector 218 may detect such signals as total energy, energy per subcarrier per symbol, power spectral density and other signals. The wireless device 202 may also include a digital signal processor (DSP) 220 for use in processing signals.

The various components of the wireless device 202 may be coupled together by a bus system 222, which may include a power bus, a control signal bus, and a status signal bus in addition to a data bus.

Certain aspects of the present disclosure support a low-complexity encoder compression for broad class of signals, which may not be well modeled as sparse signals in either time-domain or frequency-domain. First, a signal may be split in time-segments that may be either sparse in time domain or sparse in frequency domain—for example by making use of absolute second order differential operator on the input signal. Next, different encoding strategies may be applied for each of these time-segments depending in which domain the sparsity is present.

According to certain aspects, methods for signal compression and reconstruction may be implemented, for example, at the processor 204 of the wireless device 202 from FIG. 2. The proposed methods may be suitable for sensor network applications with power constraints at sensor nodes—because it may provide with a low-complexity encoder, and may offload decoder complexity to a receiver, specifically for radios such as Bluetooth that has prohibitively high energy/bit consumption in the context of body area networks.

An Example Body Area Network

Figure 3:
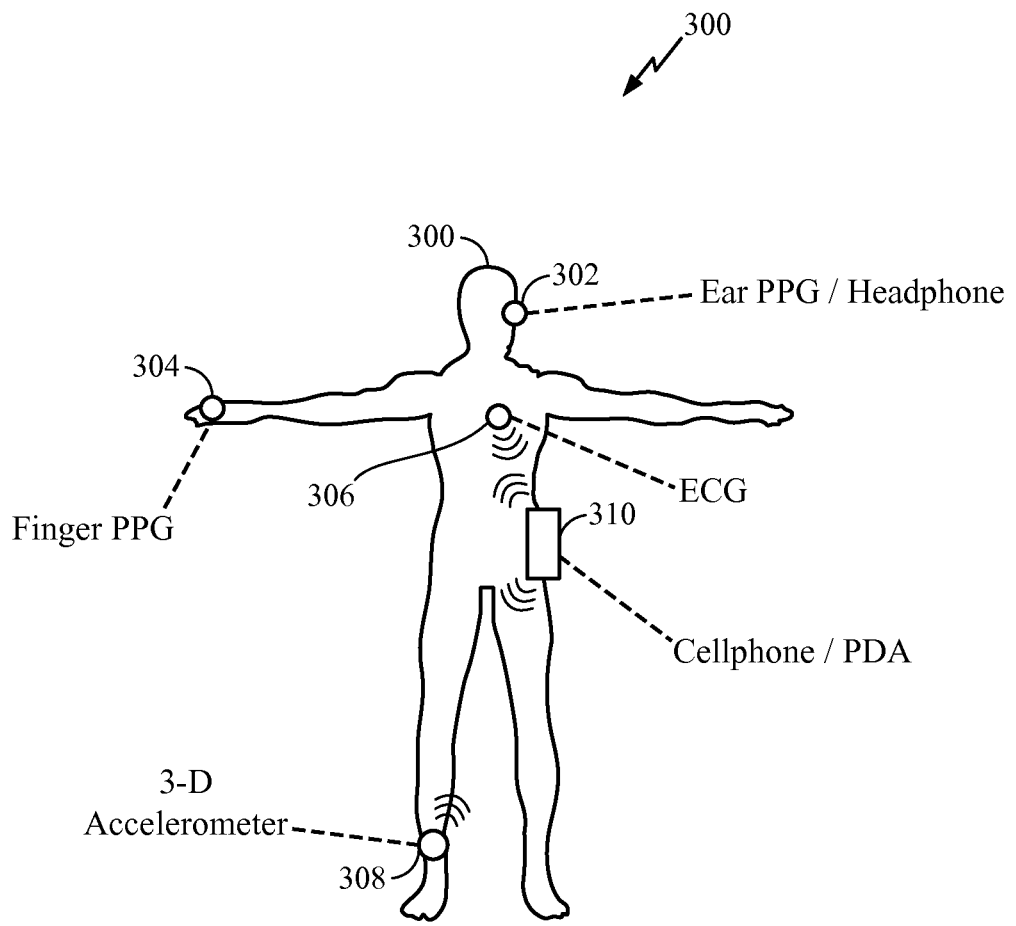
FIG. 3 illustrates an example of a body area network (BAN) in accordance with certain aspects of the present disclosure.

Certain aspects of the present disclosure may support methods implemented in body area networks (BANs). The BANs represent promising concept for healthcare applications such as continuous monitoring for diagnostic purposes, effects of medicines on chronic ailments, and alike. FIG. 3 illustrates an example of a BAN 300 that may comprise several acquisition circuits 302, 304, 306, 308. Each acquisition circuit may comprise wireless sensor that senses one or more vital biophysical signals and communicates them (e.g., over a wireless channel) to an aggregator (a receiver) 310 for processing purposes. In an aspect, the aggregator 310 may have the same or similar functionality as access points 104 from FIG. 1.

The BAN 300 may be therefore viewed as a wireless communication system where various wireless nodes (i.e., acquisition circuits and aggregator) communicate using, for example, either orthogonal multiplexing scheme or a single carrier transmission. The aggregator 310 may be a mobile handset, a wireless watch, a headset, a monitoring device, or a Personal Data Assistant (PDA), and may have the same or similar functionality as a mobile device 106 from FIG. 1 and/or a wireless device 202 from FIG. 2.

As illustrated in FIG. 3, in an aspect, an acquisition circuit 302 may correspond to an ear photoplethysmograph (PPG) sensor, an acquisition circuit 304 may correspond to a finger PPG sensor, an acquisition circuit 306 may correspond to an electrocardiogram (ECG) sensor (or an electroencephalogram (EEG) sensor), and an acquisition circuit 308 may correspond to a 3D-Accelerometer (3D-Accl) sensor. In an aspect, the acquisition circuits in FIG. 3 may operate in accordance with compressed sensing (CS), where an acquisition rate may be smaller than a Nyquist rate of signal being acquired.

According to certain aspects of the present disclosure, the wireless device 202 from FIG. 2 may be employed within the BAN 300. The wireless device 202 may correspond to the aggregator 310 or to one of the acquisition circuits 302, 304, 306, 308.

Sparsity of Signals

It may be desirable for sensors utilized in the BAN to be non-intrusive and long lasting. Photoplethysmograph (PPG) and Electro Cardiogram (ECG) signals and/or activity may be sensed or monitored for a large percentage of chronic ailments in a large segment of human population. There can be significant opportunities for wireless technologies in the BAN and mobile devices with wireless area network (WAN) connectivity to improve diagnosis and care of such ailments.

Figure 4:
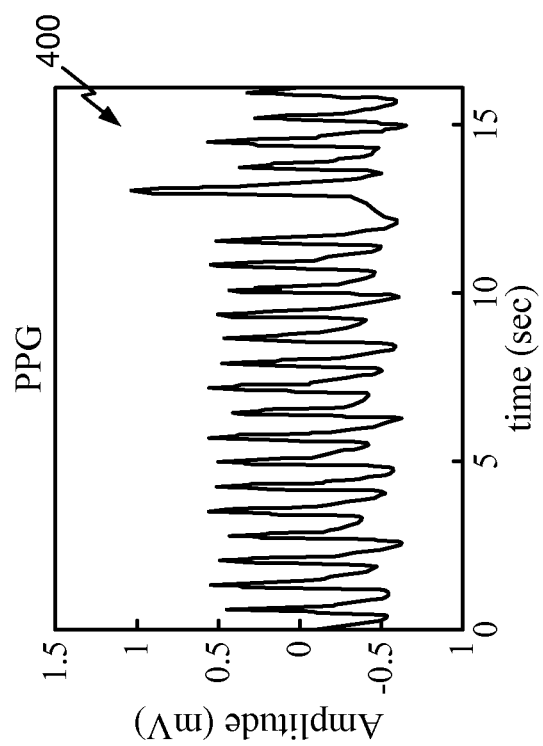
FIG. 4 illustrates an example of a time-domain photoplethysmograph (PPG) signal in accordance with certain aspects of the present disclosure.

Pulse oximeter sensors can generate the PPG waveform which may enable continuous monitoring of blood oxygenation (also called $S_pO_2$), a crucial indicator of pulmonary system including lungs and respiration. Blood carries oxygen, nutrients and chemicals to the body cells in order to ensure their survival and proper functioning, and to remove cellular wastes. $S_pO_2$ is extensively used in clinical settings for diagnosis, surgery, long term monitoring, etc. FIG. 4 illustrates an example of a time-domain PPG signal 400 in accordance with certain aspects of the present disclosure.

Figure 5:
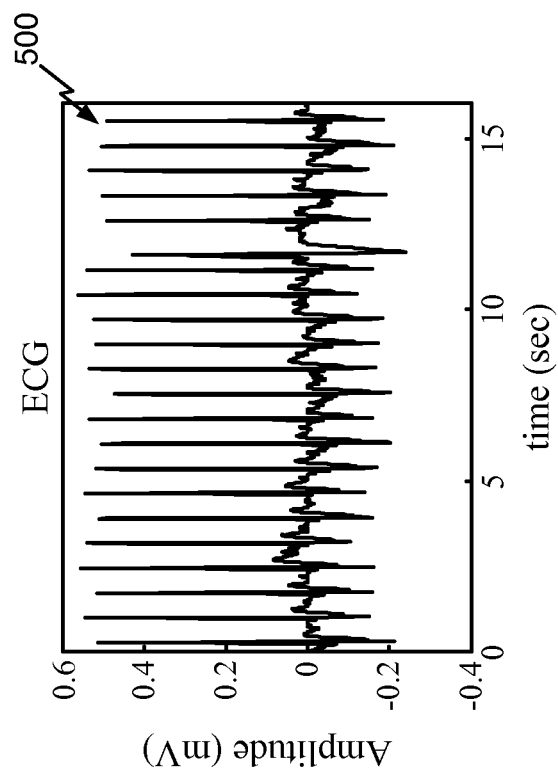
FIG. 5 illustrates an example of a time-domain electrocardiogram (ECG) signal in accordance with certain aspects of the present disclosure.

The ECG is another important vital sign for assessing the cardiovascular system. The heart is one of the most hard working body parts, pumping about six liters of blood per minute through the body in humans. Electrical signals generated during each cardiac cycle form the ECG signal and can be captured by Ag/AgCl electrode sensors. The ECG may be routinely used in clinical settings for diagnosing heart related problems, and continuous monitoring of the ECG may enable early diagnosis of many chronic conditions. FIG. 5 illustrates an example of a time-domain ECG signal 500 in accordance with certain aspects of the present disclosure. Blood pressure (BP) is another vital sign with enormous clinical value. Systolic blood pressure (SBP) and diastolic blood pressure (DBP) may be estimated using the ECG and the PPG signals.

In certain aspects, one or more of the sensors 302, 304, 306, 308 and/or the aggregator 310 described herein make use of compressed sensing (CS). In CS, signals acquired at the sensors 302, 304, 306, 308, for example the PPG signal illustrated in FIG. 4 or the ECG signal illustrated in FIG. 5, may be compressed during or after acquisition for more efficient transmission and/or storage. Further, signals encoded using a CS approach described herein may be decoded at the aggregator 310. In some aspects, significantly fewer sensor samples than that suggested by the Shannon/Nyquist sampling theorem can be used to recover signals with arbitrarily fine resolution.

For example, consider a short term segment of a band-limited signal x(t) of duration T and bandwidth B. Let x(n), 1≤n≤N, represent a discrete version of x(t), $$x(n) = x(t)|_{t=nT_s} \quad (1)$$

such that $T_s \leq 1/2B$.

From the Nyquist sampling theorem, it can be recognized that x(t) can be reconstructed if there are at least N=T*2B samples, uniformly spaced between 0 and T at every $T_s=1/2B$ seconds. Then, $F_s=2B$ is the Nyquist sampling frequency. The fact that x(t) can be reconstructed from N samples stems from the equivalence of continuous and discrete Fourier spectra X(f) and X(ω) in the range {−B, B}. If x(n) is quantized with q bits per sample, the Nyquist rate is $q*F_s$ and provides 6q dB dynamic range in the discrete domain. In the Fourier space, x can be represented as $$X = Wx, \quad (2)$$

where W is an orthonormal basis set consisting of exponentials and can be written as an N×N matrix $$[W]_{m,n} = \frac{1}{\sqrt{N}} e^{[-i(2\pi/N)mn]}.$$

In CS, the signal samples r(n), 1≤k≤K can be mathematically represented as $$r = Hx, \quad (3)$$

where H is a K×N matrix. For the Nyquist case, $H=I_N$, an identity matrix of size N.

In some aspects, x(t) has a lot of redundancy in the time domain, such that there are only M components with magnitude greater than ε in X of equation (2), where ε<<max(X), and M<<N. In this case, W may be referred to as the sparse basis. In a CS paradigm as described herein, if one is able to construct a sensing matrix H of dimension K×N that is statistically incoherent with the sparse basis W, then only K samples from equation (3) are adequate to estimate x with a high probability of some small reconstruction error, provided K≥M*log(N/M). The elements of H may be generated using some random process to meet the constraint of statistical incoherence with the known basis W. One approach to signal reconstruction from (r, H, W) can be an iterative process called the gradient-projection based sparse reconstruction (GPSR), given as $$\hat{y} \equiv \min_y \left[ \|HW^{-1}y - r\|^2 + \tau \sum_{i=1}^{N} |[f]_i [y]_i| \right], \quad (4)$$

and $$\hat{x} = W^{-1}\hat{y}. \quad (5)$$

In the optimization process of equation (4), the first term may enforce sample fidelity and the second term may enforce signal sparsity. The quantity τ is a non-negative parameter providing relative weight of $L_2$-norm and $L_1$-norm in the cost function. The terms $[f]_i$ and $[y]_i$ denote the $i^{th}$ element of vectors f and y, respectively. The term f was introduced to incorporate a priori sparsity information in the $L_1$-norm during reconstruction. In some aspects, f may be estimated offline. In one aspect, W can be considered as Gabor functions, consisting of various cosine waves with time support limited by Gaussian window functions at different scales, such that the (i, j) entry of W is given by $$[W]_{m,n} = \cos\left(\frac{2\pi mn}{2N}\right) \times \exp\left(-\frac{m^2(n-N/2)^2}{wN^2}\right), \quad (6)$$

where m, n=0 . . . N−1. The term w is associated with the width of the Gaussian kernel. Each row of the matrix W can be normalized such that its $L_2$-norm is equal to 1.

Thus, CS as described herein may involve identifying a sparse basis W, designing an appropriate sensing kernel H in equation (3) that is incoherent with W, and a reconstruction recipe such as equation (4) that also incorporates a priori information. Equation (5) can then be used to estimate the signal with K samples instead of N samples. An under sampling ratio (USR) can then be defined as N/K.

The reconstruction process may be an iterative approach, such that $\hat{x}$ may be defined as in equations (4)-(5), where the optimization cost function $f(r, H, W)$ can be comprised of several additive terms enforcing various constraints (for example, in a weighted manner similar to a Lagrange formulation). The various individual components for function $f$ may include:

i. $L_2$ norm on the sample error=$\|r-H\hat{x}\|_{L_2}$.
ii. $L_p$ norm on the sparse transformation $\hat{y}=\|W\hat{x}\|_{L_p}$, where p≤1.
iii. $L_2$ norm on the smoothness error=$\|g(r)-\hat{x}\|_{L_2}$, where g(r) is the interpolated version using the samples r, and the interpolation g can be cubic spline based, chirp based, etc.

Other approaches to encoding a given class of signals for transmission and compression may comprise a learning process based on these signals. In certain cases, the learning process may provide an optimized representation basis W where the optimality criteria can be based on minimizing the number of coefficients (i.e., M) greater than ε. Once the learning process has been completed for such class of signals, the input signal x may be modeled as coefficients in the W projection space, which are then selectively used for generating the encoded representation.

Signals such as ECG signals may vary between individuals, as well as between different times. For example, an arrhythmia or other heart condition may cause significant variations in the ECG signal. Due to these variations, the learning process discussed above may need to be performed for each signal; a model developed for one signal may not be appropriate for another signal. Performing a learning process for each signal may reduce the speed and efficiency of processing signals. Attempts to generate a general model that does not require a learning process have generally been ineffective.

Still other approaches to encoding signals such as ECG signals may comprise taking samples in a transform domain. For example, ECG coefficient may be encoded in a wavelet domain. Such encoding may be highly complex and may require a large power input.

In certain aspects, devices described herein and/or devices implementing methods described herein may encode and/or decode a broad range of signals, for example including ECG signals as well other signals that may be generated in a biomedical or BAN context. The signals may not be limited to signals that have been learned, nor may be the signals limited to a class of signals that satisfy a particular model.

In certain aspects, devices described herein and/or devices implementing methods described herein may process data, resulting in reduced power consumption as compared to previously known devices. For example, one or more of the methods and/or devices described herein may be utilized to implement CS as described above to reduce a power at an encoding device. In addition, devices described herein may have a lower complexity than previously known devices. Reducing complexity in this way may reduce costs of manufacture, battery usage, and/or memory usage, and may increase efficiency and speed. In some aspects, data may be sampled at a rate below the Nyquist sampling rate and compression of the data may be achieved without significant loss. For example, the PPG signal of FIG. 4 or the ECG signal of FIG. 5 may be sampled and/or compressed, and may thereafter be packetized, stored, and/or transmitted. Certain aspects may shift computational complexity from an encoder with stringent power requirements to a decoder with flexible power budget, for example in order to increase working life of sensors employed in the BAN.

In certain aspects, devices described herein and/or devices implementing methods described herein may be used for applications concerning signal detection/classification, imaging, data compression, and Magnetic Resonance Imaging (MRI), among other applications. Benefits may include improved signal fidelity and superior recognition performance. Data processing pursuant to the present disclosure may be utilized in low power sensors within the BAN 300 for healthcare and fitness applications. One aspect of the BAN 300 in healthcare applications is to provide a reliable communication link between sensors (i.e., transmitters and/or encoders) and an aggregator (i.e., a receiver and/or a decoder), while reducing sensor power and communication latency. In other aspects, these benefits are provided between sensors (i.e., a transmitter and/or encoder) and a remote device (i.e., a receiver and/or a decoder), for example a base station, cell phone, PDA, or computer. Signals transmitted from the aggregator may be used to track or monitor health, well-being, and/or fitness. For example, signals from one or more of the sensors 302, 304, 306, 308 may be transmitted to the aggregator 310, which may transmit, via a cellular network, information associated with those signals or those sensors to a medical facility where a medical professional may monitor the signals. In this way, a doctor or nurse, for example, may be able to detect any abnormal health conditions of an individual wearing the sensors.

Methods and techniques described herein may comprise determining sparsity of a signal or of a signal at a point therein. As described above, signals may be encoded using a sensing kernel H that is incoherent with W and using a sparse basis W. Generally, the more sparse a signal, the more the signal can be compressed. Most signals, however, are not sparse in any given domain or basis. As described further below, however, obtaining one or more samples of a signal at a point (sample) based on a determined type of sparsity may be beneficial. Obtaining samples in this way may yield a low-complexity encoder compression strategy for a broad class of signals, for example signals that are not modeled well as sparse in either the time domain or the frequency domain.

Some signals that are processed and/or encoded, for example in the BAN 300, may be decomposed primarily into tones and transient segments. These signals may be efficiently encoded, thereby reducing the time and power required for the encoding, by determining a type of sparsity of a signal at a point before obtaining samples of the signal at that point. An encoder may thus obtain the sample using the sparsity information previously determined.

Low-Complexity Compression of Signals

Figure 6:
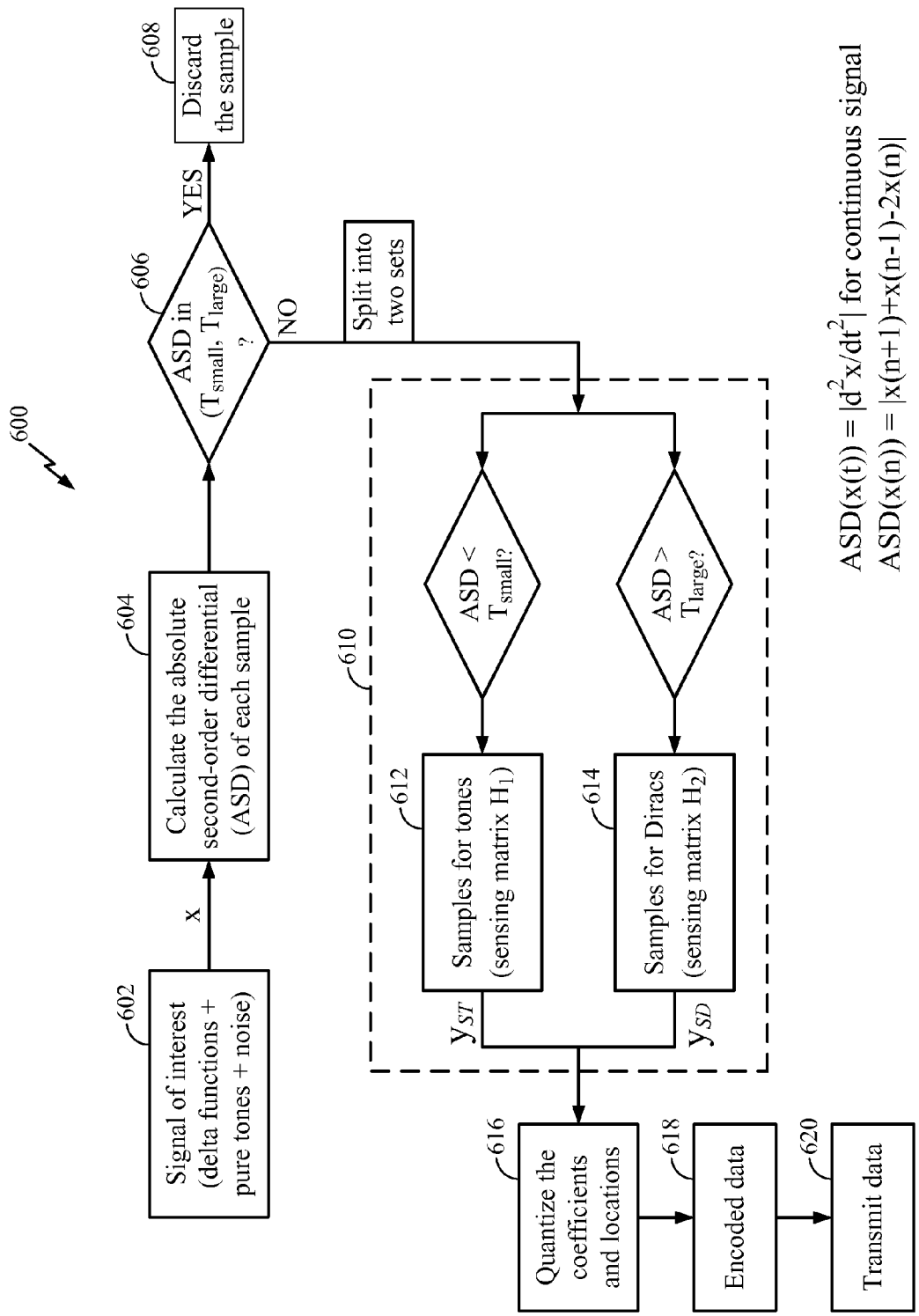
FIG. 6 illustrates an example flowchart for a method of encoding a signal at a sensor in accordance with certain aspects of the present disclosure.

FIG. 6 illustrates an aspect of a method 600 for encoding a signal. The method may be, for example, implemented by the sensors 302, 304, 306, 308 of the BAN 300 from FIG. 3.

At step 602, samples of a signal of interest may be identified. As discussed above, the signal may be decomposed primarily into tones and transient segments. Additionally, noise may be introduced into the signal during the sensing process by a transducer or due to many other factors. The samples may be conceptualized or represented by a vector x. According to certain aspects, the samples in the signal may be processed in a plurality of windows. Thus, in some aspects, x represents the samples identified in a given window of the signal.

After the samples are identified at step 602, the sparsity of the signal at these samples may be determined. In the aspect illustrated in FIG. 6, it may be determined whether the signal at each sample in x is sparse in the time domain or in the frequency domain.

In order to determine whether the signal is sparse at a point (sample) in the time or frequency domain, the absolute second-order differential (ASD) of each sample may be calculated at step 604. For analog or continuous signals x(t), the absolute second-order differential may be calculated as:

$$ASD(x(t)) = |d^2x/dt^2|. \qquad (7)$$

For digital or discrete signals x(n), the absolute second-order differential may be calculated as:

$$ASD(x(n)) = |x(n+1) + x(n-1) - 2x(n)|. \qquad (8)$$

At step 606, it may be determined whether the ASD of a sample of x is between a first threshold, $T_{small}$, and a second threshold $T_{large}$. Samples that are between these two thresholds may be determined to be sparse in neither the time domain nor the frequency domain, and may be discarded at step 608. One or both of the thresholds $T_{small}$ and $T_{large}$ may be determined a prior, or one or both of the thresholds $T_{small}$ and $T_{large}$ may be dynamically determined, so as to be adaptive to the samples of x.

Based on the determined sparsity of the samples of x, the samples may be split into two sets in step 610. As discussed above, the aspect of the method 600 illustrated in FIG. 6 may comprise determining whether the samples are sparse in the time domain or the frequency domain. If the ASD of a sample is less than or equal to $T_{small}$, then the sample may be determined to be sparse in the frequency domain and the sample may be placed into a set of tones at step 612. By placing this sample of x into the set of tones identified as being sparse in the frequency domain, a sensing matrix $H_1$ may be generated. In the illustrated aspect, the sampled tones are output as $y_{ST}$.

If the ASD of a sample is greater than or equal to $T_{large}$, then the sample may be determined to be sparse in the time domain and the sample may be identified, at step 614, as the sample of transient segments (Diracs). By identifying this sample of x into transient segments identified as being sparse in the time domain, a sensing matrix $H_2$ may be generated. In the illustrated aspect, the sampled transient segments are output as $y_{SD}$.

The tones and/or transient segments may be sampled at fewer points than identified at step 606. For example, when the number of points that are identified as being sparse in the time domain or the frequency domain is higher than a threshold, the number of points or samples may be randomly selected. Thus, one or more of $H_1$ and $H_2$ may be randomly designed. Further, some $H_i$ may comprise inflection point sampling information.

At step 616, values of the samples obtained at step 610 may be quantized. Locations of these samples may also be quantized. In the illustrated aspect, a value and/or locations of the sampled tones and transient segments may be quantized at step 616 to encode the signal (i.e., to obtain encoded data 618). The value and location of a sample may be represented in any number of ways and may be quantized using any number of devices or methods. The location may be quantized as a tread. In some aspects, the value of the samples may be quantized with q bits each using a non-uniform quantization law, and the locations may be quantized with p bits each, for example using a binary counter. The quantized value and/or location may be packetized for transmission.

At step 620, the quantized value and/or the quantized location may be transmitted. In an aspect of the present disclosure, the quantized value and/or location of the sample or information indicative thereof may be wirelessly transmitted, for example to the aggregator 310. Before the transmitting, a header identifying the type of sparsity of the signal at the sample may be appended. In one aspect, information or data regarding all of the samples that are sparse in the time domain may be transmitted before information or data regarding all of the samples that are sparse in the frequency domain, or vice versa.

Data received from the signal encoded by the sensor may have certain properties which facilitate the decoding of the data and the estimation of the signal, for example by the aggregator 310 or using a method 700 which will be described in greater detail below.

As discussed above, the sampled tones and transient segments may be output as $y_{ST}$ and $y_{SD}$. The matrices used to sense these samples may be $H_1$ and $H_2$, respectively. The set of such samples can be described as y, where:

$$y = \begin{bmatrix} y_{ST} \\ y_{SD} \end{bmatrix} = \begin{bmatrix} H_1 x \\ H_2 x \end{bmatrix} = \begin{bmatrix} H_1 \\ H_2 \end{bmatrix} x = Hx. \quad (9)$$

Further, the tone frequencies can be represented by $\{f_i\}_{i=1}^{K_1}$ where $K_1$ is the number of sampled tones. The transient segments can be represented by $\{d_i\}_{i=1}^{K_2}$ where $K_2$ is the number of sampled transient segments. In one aspect, the number of samples that the encoder obtains ensures accurate decoding, and may be described by:

$$\text{samples} = O\left(K_1 \cdot \log \frac{N}{K_1}\right) + O(K_2), \quad (10)$$

where O is the order.

Therefore, the signal projection space W can be described as $$W = [W_T; W_D] \in C^{N \times (K_1 + K_2)}, \quad (11)$$

where $$W_T(i) = \begin{pmatrix} 1 \\ e^{jf_i} \\ \vdots \\ e^{j(N-1)f_i} \end{pmatrix}, \quad (12)$$

and $$W_D(i) = \begin{pmatrix} \delta(d_i) \\ \delta(d_i - 1) \\ \vdots \\ \delta(d_i - N + 1) \end{pmatrix}. \quad (13)$$

In some aspects, each column of $W_T$ represents a tone frequency vector. In one aspect, each column of $W_D$ represents a transient segment.

Based on these properties, a signal representation x can be calculated from $$x = W\alpha, \quad (14)$$

where α can be estimated using least-squares estimation from $$y = (HW)\alpha \quad (15)$$

The aggregator 310 may be configured to utilize the equations (9)-(15) to reconstruct a signal. One aspect of a method that the aggregator 310 may utilize is described below.

Figure 7:
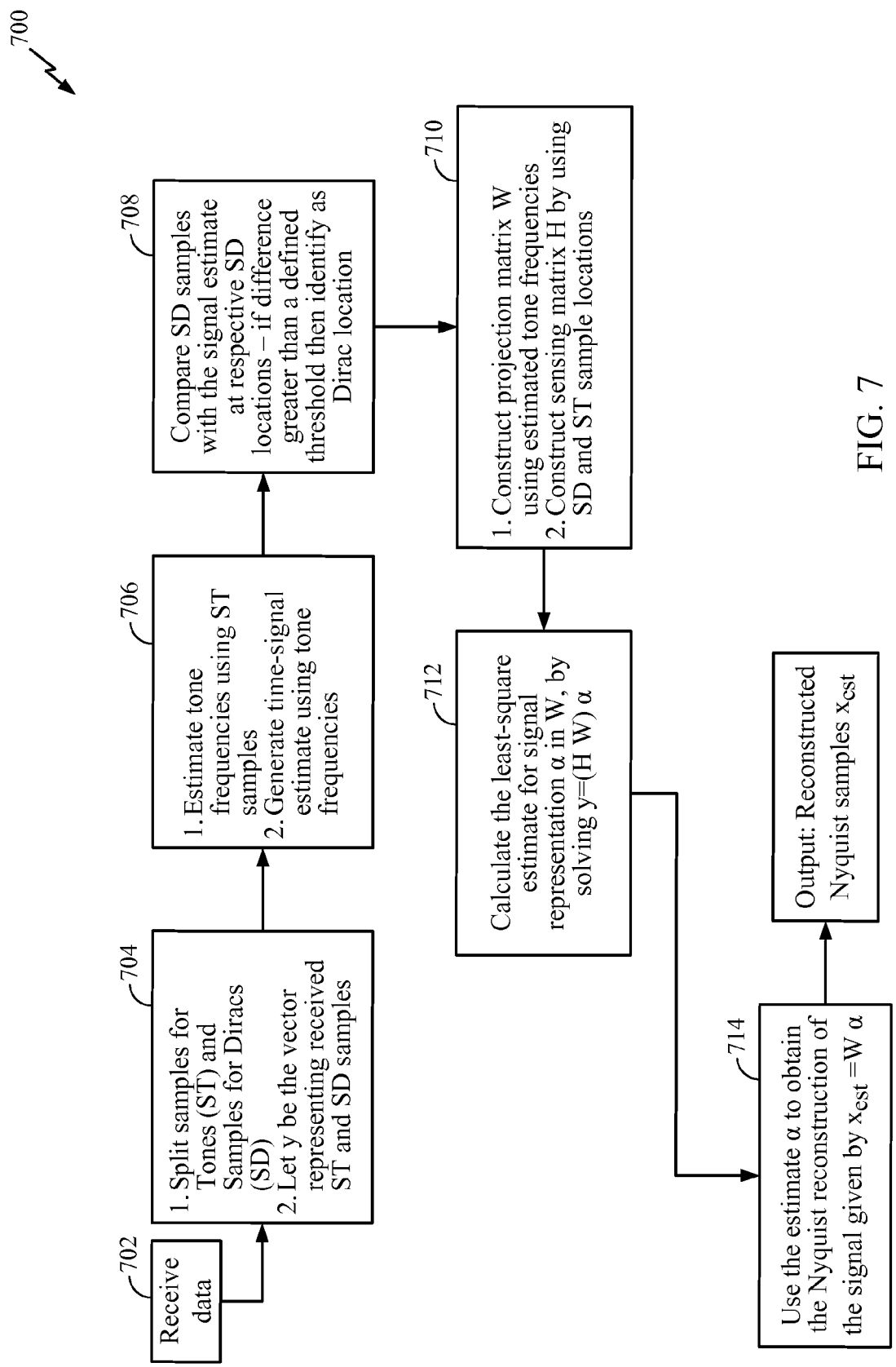
FIG. 7 illustrates an example flowchart for a method of decoding data at an aggregator (receiver) in accordance with certain aspects of the present disclosure.

FIG. 7 illustrates an aspect of the method 700 for decoding data. The method may be implemented by the aggregator 310 from FIG. 3, for example. At step 702, data representative of one or more samples may be received. At step 704, a type of sparsity of a signal at a sample (point) may be determined. In the illustrated aspect, determining the type of sparsity of a signal at a sample may comprise determining whether the sample is sparse in the time domain or the frequency domain. For example, samples for which the data was received at step 702 may be split into samples for tones (ST) and samples for transient segments (Diracs) (SD) based on the received data. In some aspects, as aforementioned, the type may be determined using a header of the received data packet.

At step 706, the tone frequencies may be estimated from $y_{ST}$. The tone frequencies may be estimated from the samples that were determined to be sparse in step 704. Step 706 may further comprise generating an estimate of the signal to be reconstructed. In the illustrated aspect, a time-signal estimate may be generated using the estimated tone frequencies. For example, the signal may be estimated utilizing the inverse of a transform used when sampling the signal x(t) or x(n).

At step 708, the data from the samples determined to be sparse in the time domain may be compared to the signal estimated at step 706. In the illustrated aspect, the transient segments of the samples sparse in the time domain are compared to the estimated signal at corresponding locations. If the difference is greater than a defined threshold, then the location may be identified as a transient location. In this way, nearby portions of the signal that were identified as transient segments during encoding may be omitted from the reconstruction.

After the tone frequencies and transient segments are estimated in steps 706 and 708, respectively, the projection space of the signal may be estimated at step 710. In the illustrated aspect, a matrix W may be generated using the estimated tone frequencies and transient segments (Dirac locations). The construction of matrix W was discussed above with respect to equations (11)-(13).

In the illustrated aspect, the step 710 may further comprise constructing a sensing matrix H using SD and ST sample locations. The construction of H was discussed above with respect to equation (9).

At step 712, the least-squares estimate for a signal representation α may be estimated based on the projection space and the sensing matrix constructed at step 710. This may be accomplished, for example, by solving equation (15) discussed above.

At step 714, the estimate of α may be used to reconstruct the signal x̂. This may be accomplished, for example, by solving equation (14) discussed above. In one example, the samples identified at the Nyquist rate may be reconstructed. In this way, the method 700 may be used to decode wirelessly received data, for example to reconstruct a signal encoded by the sensor.

Determining the type of sparsity of the signal at a location before obtaining a sample at that location may also be beneficial for signals that can't be decomposed primarily into tones and transient segments. A more general approach to encoding such signals may not compress the signals as much as the apparatuses and methods described above, but can be used for a broader class of signals while still achieving a beneficial level of compression. In this way, an apparatus or method, for example as described below, may be used to encode any number of signals using determined sparsity information.

Figure 8:
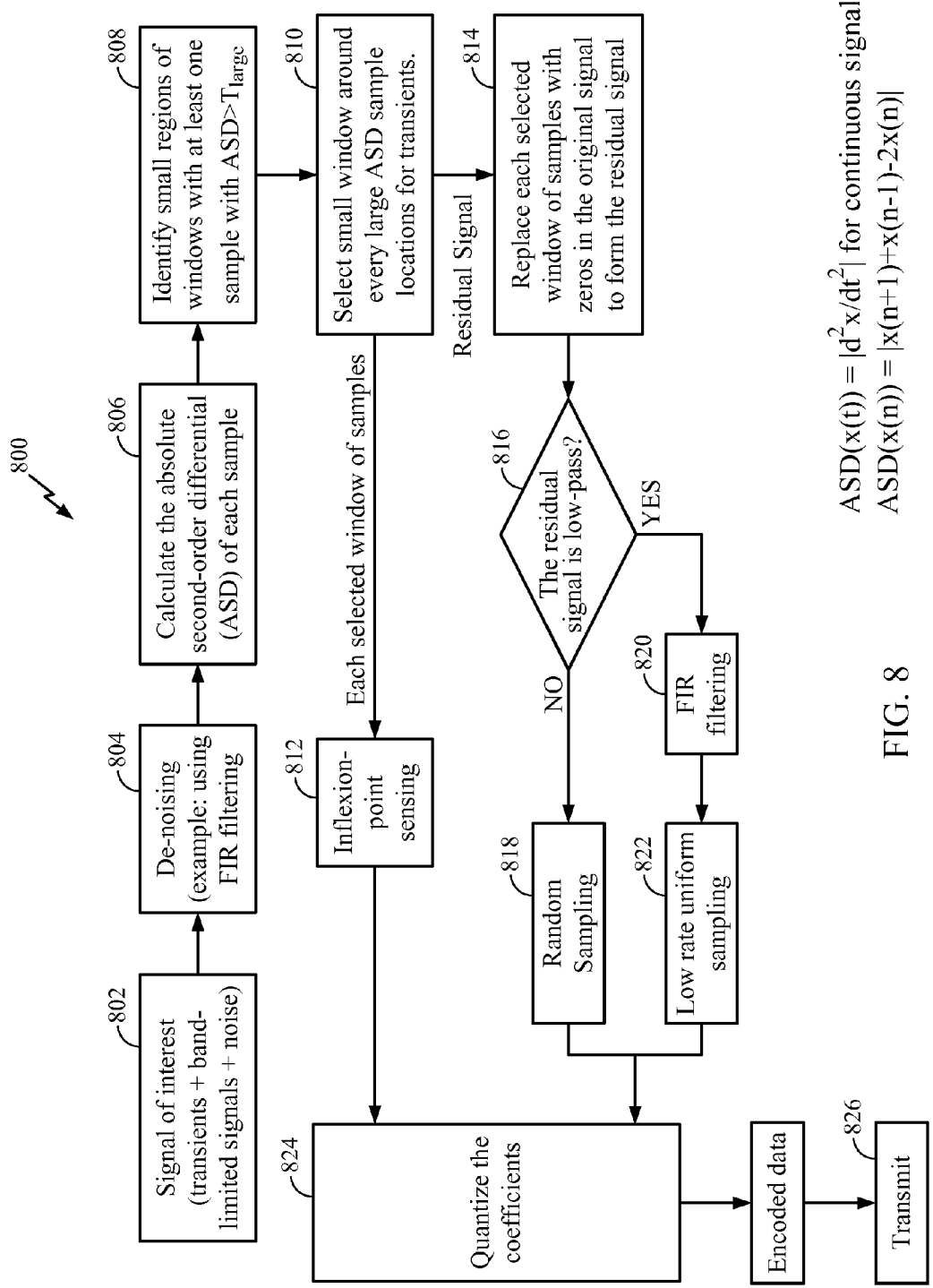
FIG. 8 illustrates another example flowchart for a method of encoding a signal at a sensor in accordance with certain aspects of the present disclosure.

FIG. 8 illustrates an aspect of a method 800 for encoding a signal. The method may be implemented by the sensors 302, 304, 306, 308 of the BAN 300 from FIG. 3, for example. Although the method below will be described with respect to elements of the sensors from the BAN 300, those of skill in the art will appreciate that other components may be used to implement one or more of the steps described herein.

At step 802, points (samples) of a signal of interest may be identified. In an aspect, the samples in the signal may be processed in a plurality of windows. The step 802 may be performed similar to the step 602 illustrated in FIG. 6.

After the samples are identified at step 802, the samples may be filtered, for example to de-noise the samples. As illustrated in FIG. 8, the filtering may be performed, at step 804, by using a Finite Impulse Response (FIR) filter.

At step 806, the sparsity of the samples may be determined. In the aspect illustrated in FIG. 8, it may be determined whether a sample is sparse in the time domain. In order to determine whether a sample is sparse in the time domain, the ASD of the sample may be calculated at step 806, as described above with respect to the step 604 illustrated in FIG. 6.

At step 808, it may be determined whether the ASD of a sample is greater than or equal to a threshold, for example $T_{large}$. If the ASD is larger than or equal to the threshold, then the sample may be determined to be sparse in the time domain. In some aspects, an ASD of any sample within a region may be determined to be greater than or equal to the threshold to determine that the region is sparse in the time domain.

At step 810, a small window around every large ASD sample locations may be selected. These windows may correspond to transients of the signal x(t) or x(n). Following this, inflection point sensing may be performed at step 812 with respect to a window selected at the step 810.

At step 814, samples in each window selected at the step 810 may be replaced with samples of defined values to form a residual signal. In the illustrated aspect, all samples in that window may be replaced with zeros in order to form the residual signal. In some aspects, the samples in that window may be replaced with samples having values that are similar to values of a portion of the signal that is outside of the range. Those of skill in the art will appreciate that other values may be also used to replace the values of the samples in the selected window.

At step 816, it may be determined whether the residual signal is a low-pass signal. If the residual signal is determined not to be a low-pass signal, then the residual signal may be randomly sampled at step 818. Those of skill in the art will appreciate various methods of performing the random sampling.

On the other hand, if the residual signal is determined to be a low-pass signal at the step 816, then the residual signal may be filtered at step 820, for example using FIR filtering. Decimation of the filtered residual signal may thereafter be performed at step 822, for example using low rate uniform sampling or downconverting the filtered residual signal.

At step 824, coefficients of the samples obtained at steps 812, 818, and 822 may be quantized. Locations of these samples may also be quantized. In the illustrated aspect, a value and/or locations of the samples may be quantized at step 824 to encode the signal. In an aspect, the step 824 may be performed similar to the step 616 illustrated in FIG. 6.

At step 826, the quantized value and/or the quantized location may be transmitted wirelessly, for example to the aggregator 310. Before the transmission, a header identifying the type of sparsity of the sample may be appended. The header may additionally or in the alternative identify whether the sample was obtained from the residual signal, and whether the residual signal was a low-pass signal. In one aspect, information or data regarding all of the samples obtained from points that are sparse in the time domain is transmitted before information or data regarding all of the samples obtained from the residual signal, or vice versa. The step 826 may otherwise be performed similar to the step 620 illustrated in FIG. 6.

Figure 9:
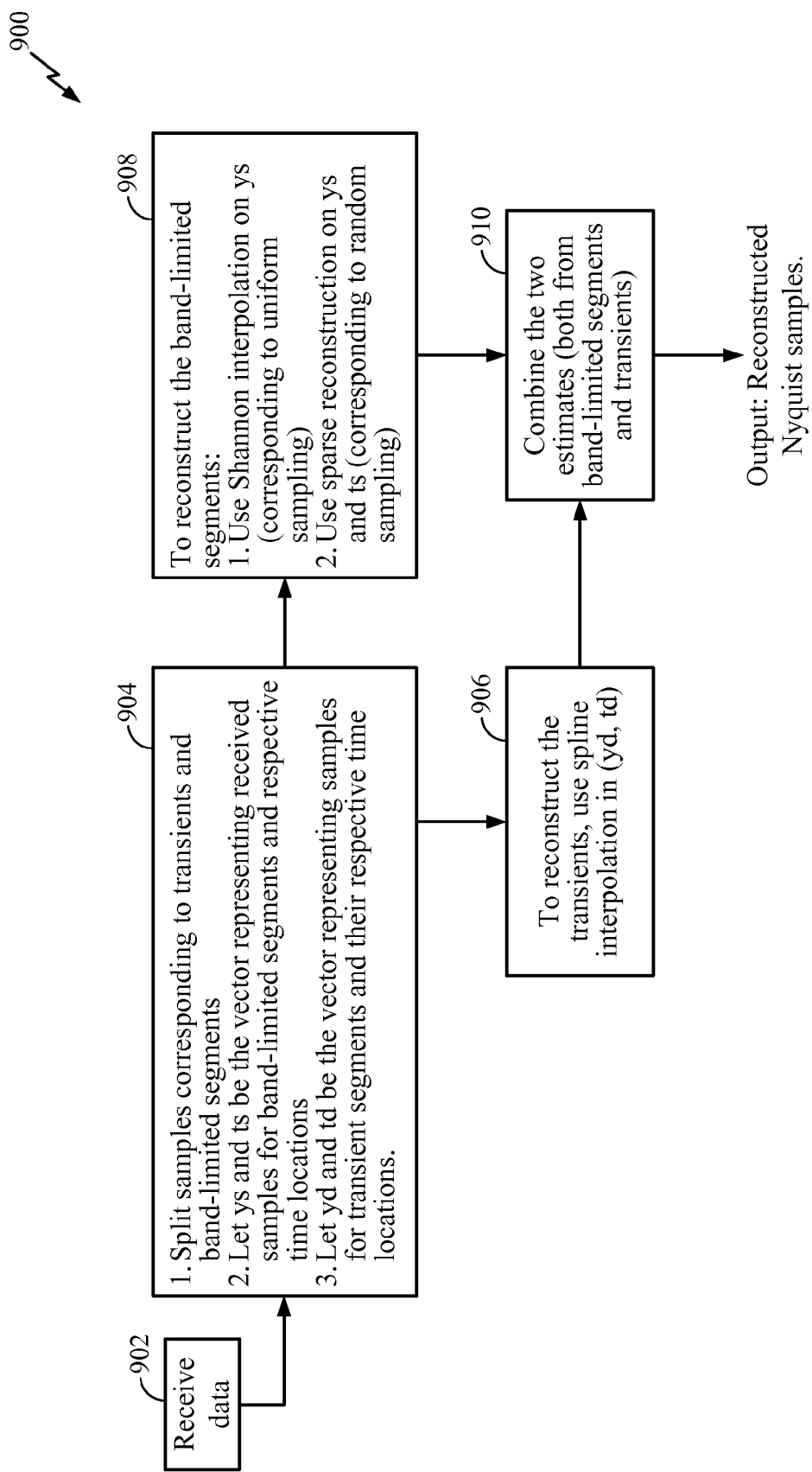
FIG. 9 illustrates another example flowchart for a method of decoding data at an aggregator (receiver) in accordance with certain aspects of the present disclosure.

FIG. 9 illustrates an aspect of a method 900 for decoding data. The method may be implemented by the aggregator 310, for example. At step 902, data representative of one or more samples may be received. In one aspect, the data may be wirelessly received. The data may comprise information representative of samples obtained from locations within a range of a signal or from a residual signal, for example.

At step 904, a type of sparsity of a sample may be determined. In the illustrated aspect, depending on whether the sample was sparse in the time domain, a sample is determined to correspond to a transient or to a band-limited segment at the step 904. In this way, the data or information representing the samples may be split between transients and band-limited segments. In some aspects, this splitting may be accomplished using a header of the received data packet. In the illustrated aspect, values of each sample corresponding to transients or band-limited segments may be stored in respective vectors yd and ys, and time locations of each of those samples may be stored in respective vectors td and ts.

At step 906 in the illustrated aspect, the vectors representing the values and time locations of the samples corresponding to transients may be used to reconstruct at least a portion of a signal. In an aspect, the reconstructed portion of the signal may comprise reconstructions of the transients, for example obtained by using spline interpolation on the vectors.

At step 908 in the illustrated aspect, the vector representing the values and/or the vector representing the time locations of the samples corresponding to band-limited segments may be used to reconstruct at least another portion of the signal. This reconstructed portion of the signal may comprise reconstructions of the band-limited segments. For points or samples that were uniformly sampled, band-limited segments may be reconstructed using Shannon interpolation on the vector of values. For points or samples that were randomly sampled, band-limited segments may be reconstructed using sparse reconstruction on the vector of values and the vector of locations. In an aspect, a header of the received data packet may be used to determine whether the points or samples were randomly or uniformly sampled. In some aspects, the locations of the points may be compared to determine whether the points or samples were randomly or uniformly sampled.

At step 910, estimates or reconstructions obtained at the steps 906 and 908 may be combined into a reconstruction of the signal. In one example, the samples identified at the Nyquist rate may be reconstructed. In this way, the method 900 may be used to decode wirelessly received data, for example to reconstruct a signal encoded by the sensors of the BAN 300.

Figure 10:
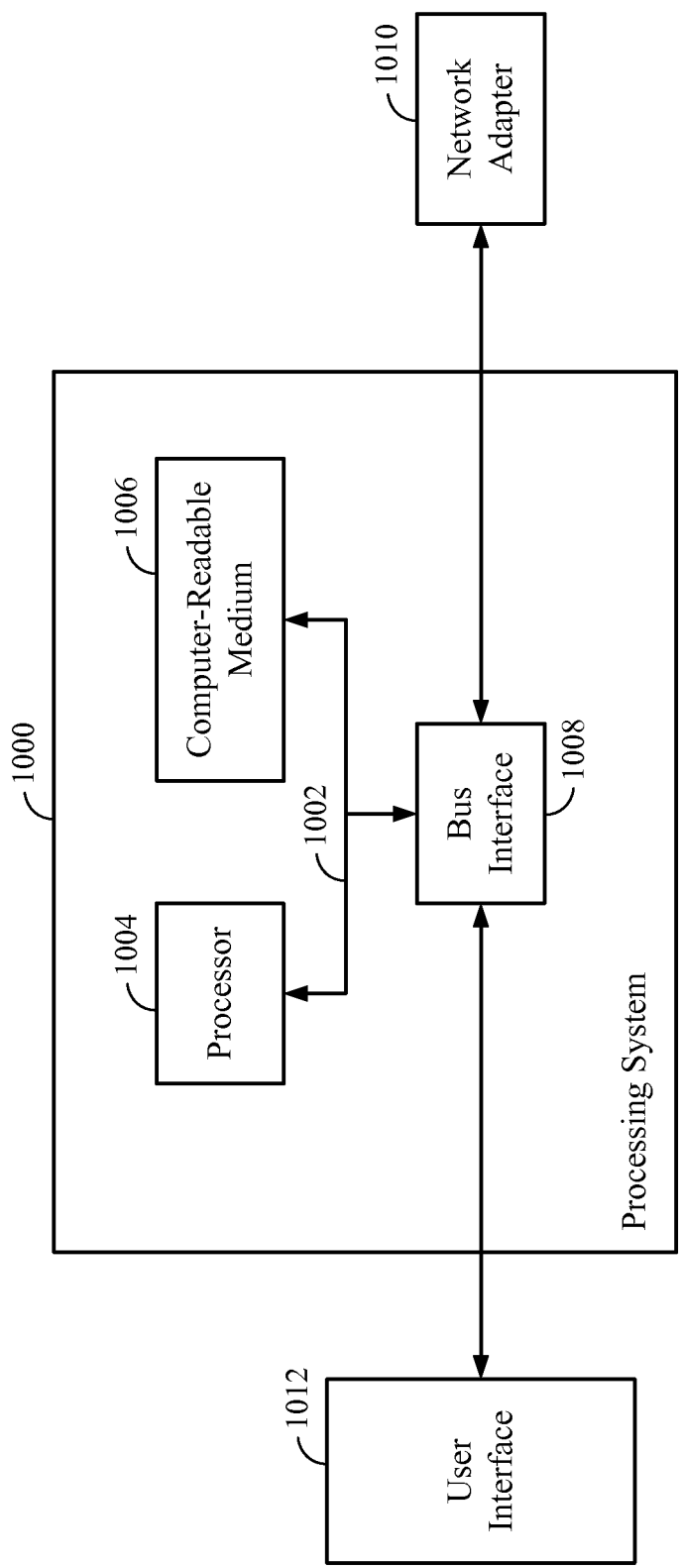
FIG. 10 illustrates an example block diagram of an apparatus of a system for low complexity compression of signals and/or signal reconstruction in accordance with certain aspects of the present disclosure.

FIG. 10 illustrates an example of hardware configuration for a processing system 1000 in a sensing circuit (or in a reconstruction circuit) that may implement the methods described herein. In this example, the processing system 1000 may be implemented with a bus architecture represented generally by bus 1002. The bus 1002 may comprise any number of interconnecting buses and bridges depending on the specific application of the processing system 1000 and the overall design constraints. The bus links together various circuits including a processor 1004, computer-readable media 1006, and a bus interface 1008. The bus interface 1008 may be used to connect a network adapter 1010, among other things, to the processing system 1000 via the bus 1002. The network interface 1010 may be used to implement the signal processing functions of the PHY layer. A user interface 1012 (e.g., keypad, display, mouse, joystick, etc.) may also be connected to the bus via the bus interface 1008. The bus 1002 may also link various other circuits such as timing sources, peripherals, voltage regulators, power management circuits, and the like, which are well known in the art, and therefore, will not be described any further.

The processor 1004 may be responsible for managing the bus and general processing, including the execution of software stored on the computer-readable media 1008. The processor 1004 may be implemented with one or more general-purpose and/or special-purpose processors. Examples include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure.

One or more processors in the processing system 1000 may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. A computer-readable medium may comprise, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, a carrier wave, a transmission line, or any other suitable medium for storing or transmitting software. The computer-readable medium may be resident in the processing system, external to the processing system, or distributed across multiple entities including the processing system. Computer-readable medium may be embodied in a computer-program product.

By way of example, a computer-program product may comprise a computer-readable medium in packaging materials.

In the hardware implementation illustrated in FIG. 10, the computer-readable media 1006 is illustrated as part of the processing system 1000 separate from the processor 1004. However, as those skilled in the art will readily appreciate, the computer-readable media 1006, or any portion thereof, may be external to the processing system 1000. By way of example, the computer-readable media 1006 may comprise a transmission line, a carrier wave modulated by data, and/or a computer product separate from the wireless node, all which may be accessed by the processor 1004 through the bus interface 1008. Alternatively, or in addition to, the computer readable media 1006, or any portion thereof, may be integrated into the processor 1004, such as the case may be with cache and/or general register files.

Figure 11:
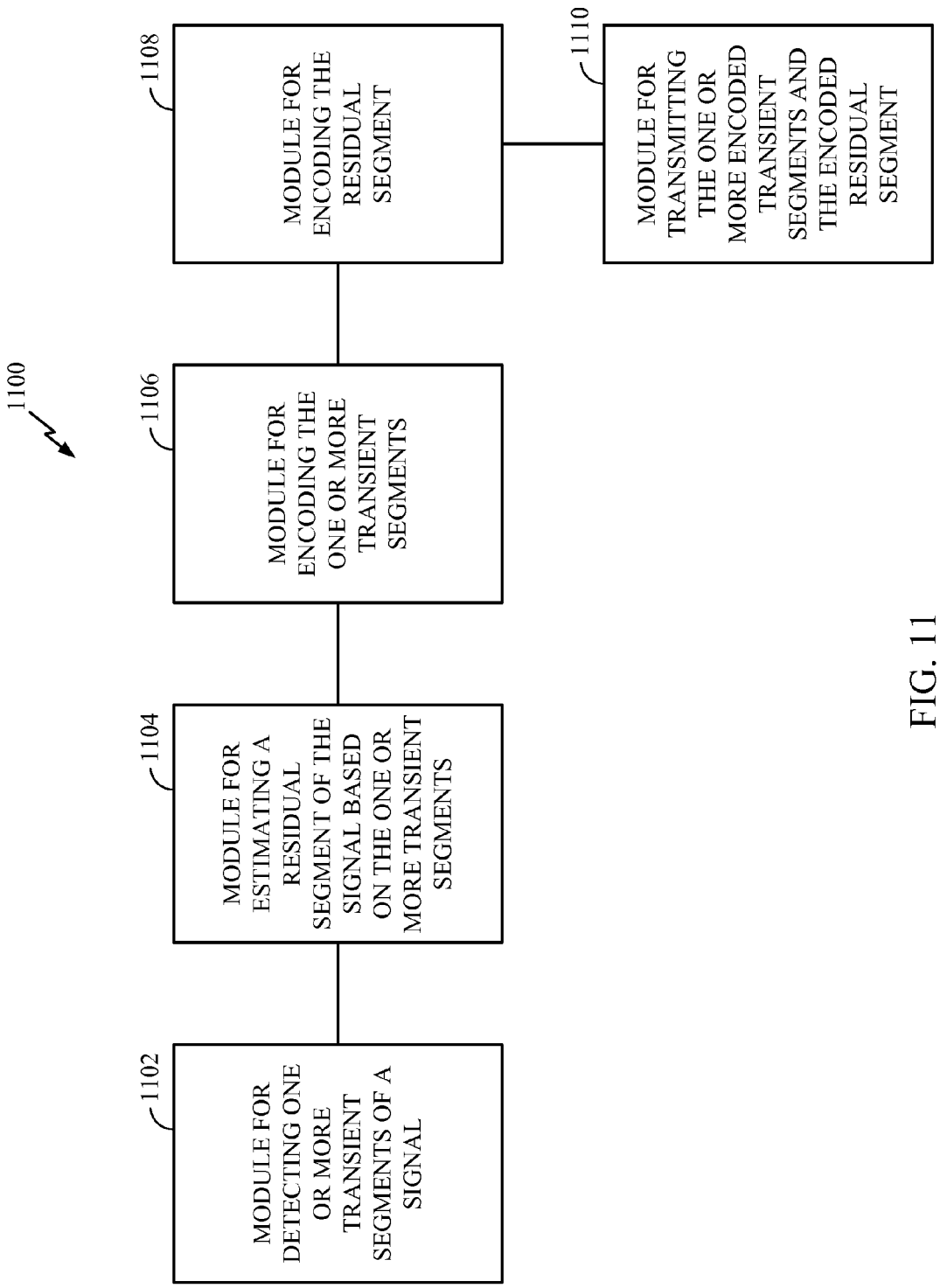
FIG. 11 illustrates an example block diagram showing the functionality of an apparatus of a system for low complexity compression of signals in accordance with certain aspects of the present disclosure.

FIG. 11 is an example diagram illustrating the functionality of an apparatus 1100 in accordance with one aspect of the present disclosure. Modules of the apparatus 1100 may perform operations of the method 800 from FIG. 8, for example. The apparatus 1100 may comprise a module 1102 for detecting one or more transient segments of a signal; a module 1104 for estimating a residual segment of the signal based on the one or more transient segments; a module 1106 for encoding the one or more transient segments; a module 1108 for encoding the residual segment; and a module 1110 for transmitting the one or more encoded transient segments and the encoded residual segment.

Figure 12:
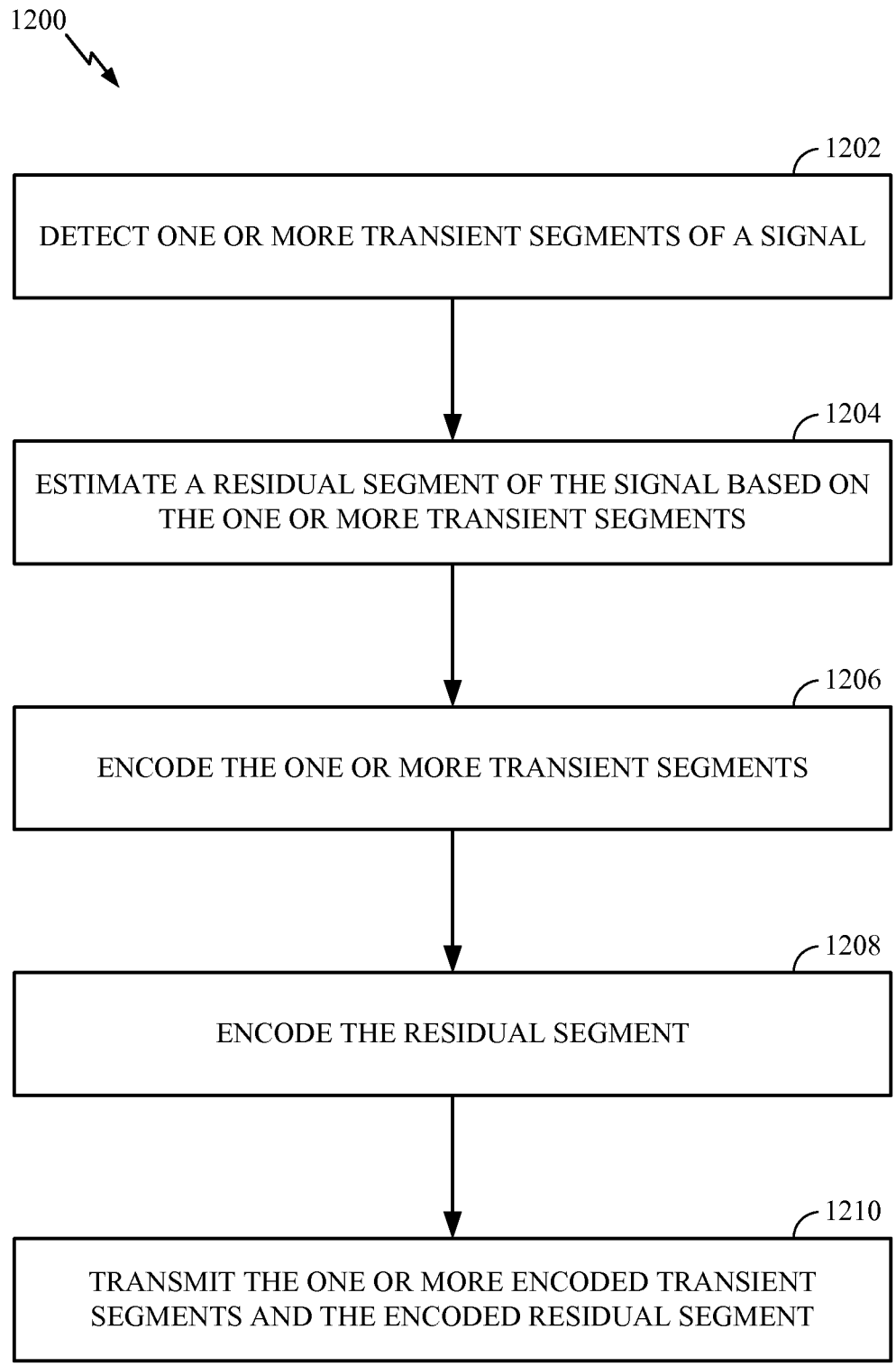
FIG. 12 illustrates example operations that may be performed at a sender device for low complexity compression of signals in accordance with certain aspects of the present disclosure.

FIG. 12 illustrates example operations 1200 for signal compression that may be performed at a sender device of a system (e.g., at one of the sensors 302, 304, 306, 308 from FIG. 3, the processing system 1000 from FIG. 10, or the apparatus 1100 from FIG. 11) in accordance with certain aspects of the present disclosure. At 1202, the sender device may detect one or more transient segments of a signal. At 1204, a residual segment of the signal may be estimated based on the one or more transient segments. At 1206, the one or more transient segments may be encoded. At 1208, the residual segment may be encoded. At 1210, the sender device may transmit the one or more encoded transient segments and the encoded residual segment to a receiver device (e.g., to the aggregator 310).

Figure 13:
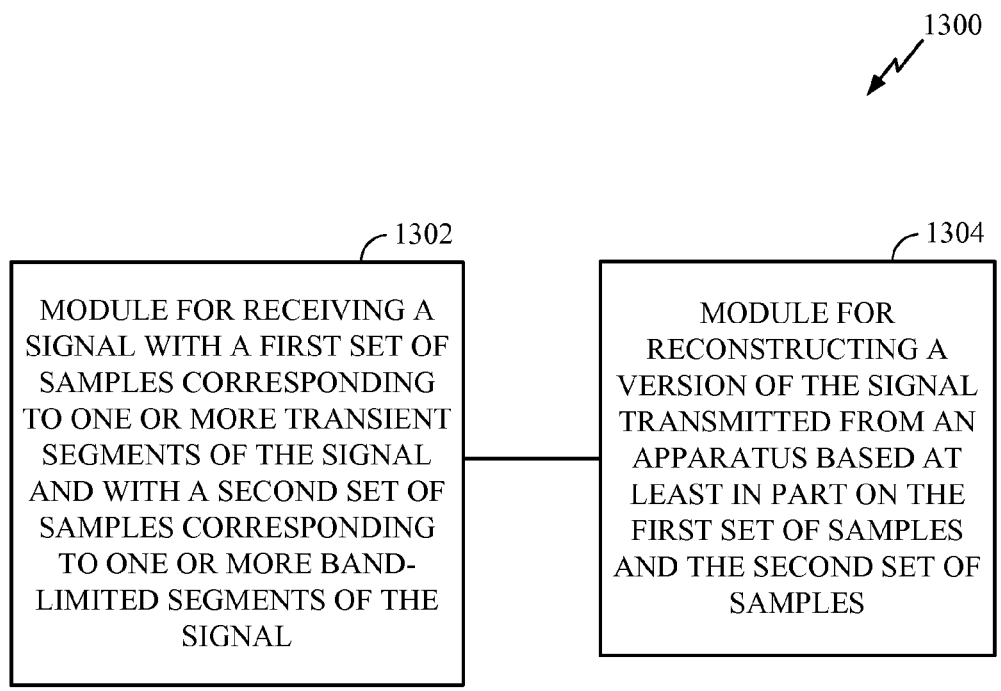
FIG. 13 illustrates an example block diagram showing the functionality of an apparatus of a system for signal reconstruction in accordance with certain aspects of the present disclosure.

FIG. 13 is an example diagram illustrating the functionality of an apparatus 1300 in accordance with one aspect of the present disclosure. Modules of the apparatus 1300 may perform operations of the method 900 from FIG. 9, for example. The apparatus 1300 may comprise a module 1302 for receiving a signal with a first set of samples corresponding to one or more transient segments of the signal and with a second set of samples corresponding to one or more band-limited segments of the signal; and a module 1304 for reconstructing a version of the signal transmitted from another apparatus based at least in part on the first set of samples and the second set of samples.

Figure 14:
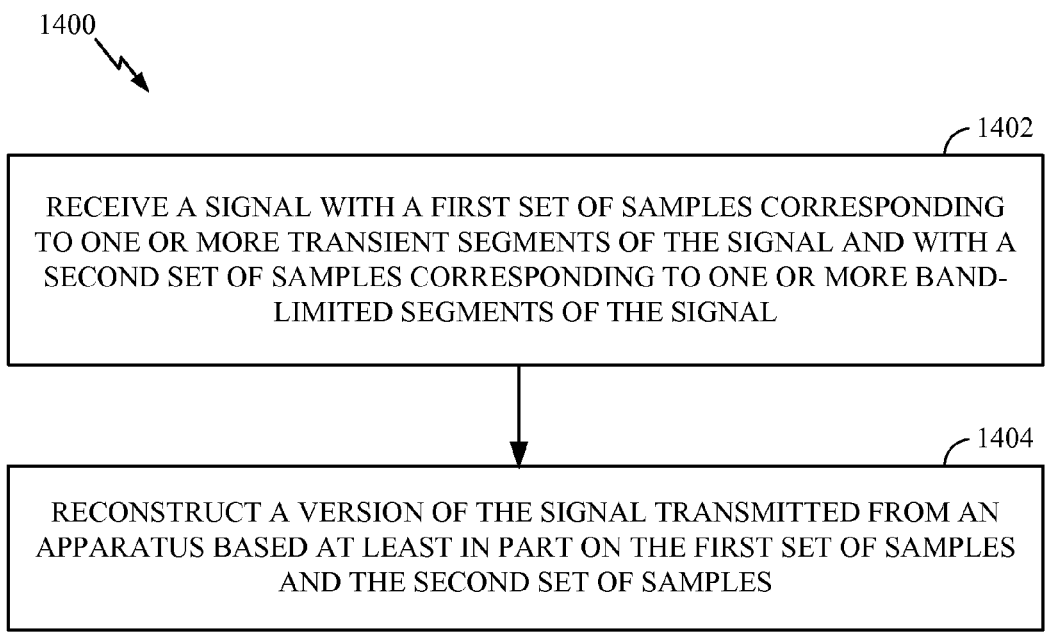
FIG. 14 illustrates example operations that may be performed at a receiver device for signal reconstruction in accordance with certain aspects of the present disclosure.

FIG. 14 illustrates example operations 1400 for signal reconstruction that may be performed at a receiving device of a system (e.g., at the aggregator 310 from FIG. 3, the processing system 1000 from FIG. 10, or the apparatus 1300 from FIG. 13) in accordance with certain aspects of the present disclosure. At 1402, the device may receive a signal with a first set of samples corresponding to one or more transient segments of the signal and with a second set of samples corresponding to one or more band-limited segments of the signal. At 1404, a version of the signal transmitted from another apparatus (e.g., from one of the sensors 302, 304, 306, 308 from FIG. 3, or the apparatus 1100 from FIG. 11) may be reconstructed based at least in part on the first set of samples and the second set of samples.

Figure 12A:
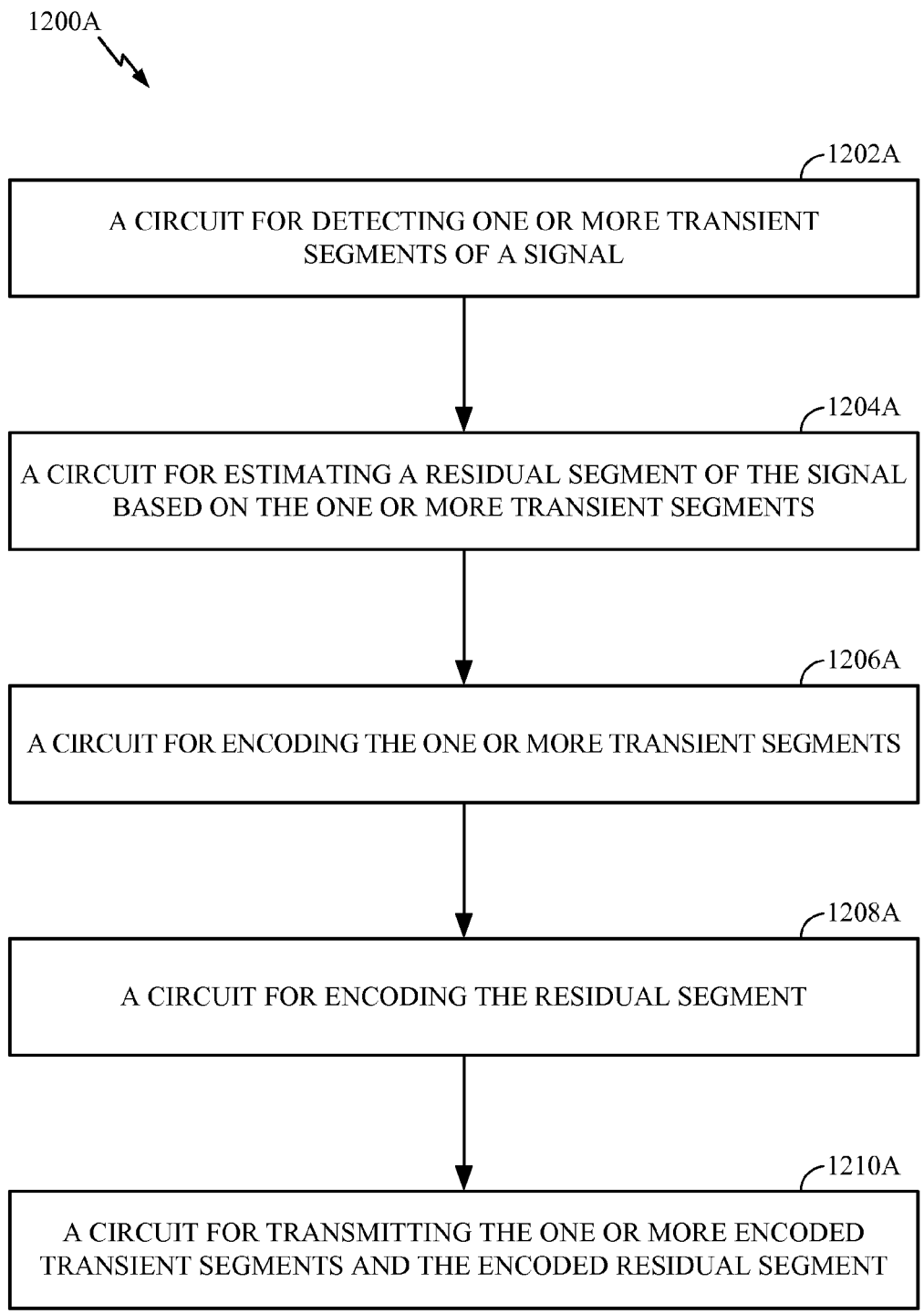
FIG. 12A illustrates example components capable of performing the operations illustrated in FIG. 12.
Figure 14A:
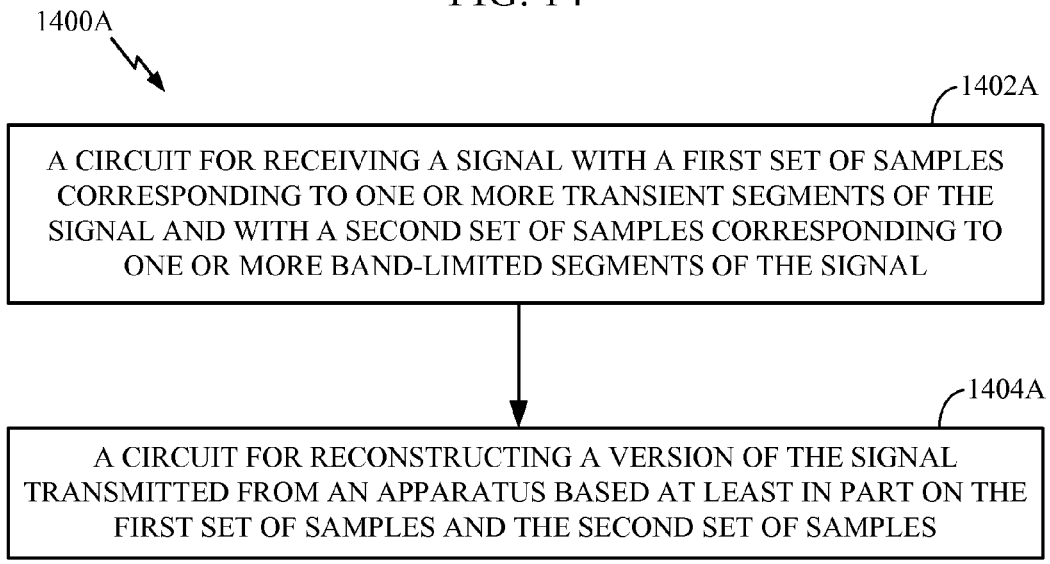
FIG. 14A illustrates example components capable of performing the operations illustrated in FIG. 14.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in Figures, those operations may have corresponding counterpart means-plus-function components with similar numbering. For example, operations 1200 and 1400 illustrated in FIG. 12 and FIG. 14 correspond to components 1200A and 1400A illustrated in FIG. 12A and FIG. 14A.

For example, the means for detecting may comprise an application specific integrated circuit, e.g., the processor 204 of the wireless device 202 from FIG. 2, the processor 1004 from FIG. 10, or the module 1102 from FIG. 11. The means for estimating may comprise an application specific integrated circuit, e.g., the processor 204, the processor 1004, or the module 1104 from FIG. 11. The means for encoding may comprise an encoder, e.g., the processor 204, the processor 1004, the module 1106 from FIG. 11, or the module 1108 from FIG. 11. The means for transmitting may comprise a transmitter, e.g., the transmitter 210 of the wireless device 202 from FIG. 2, the user interface 1012 from FIG. 10, or the module 1110 from FIG. 11. The means for applying may comprise an application specific integrated circuit, e.g., the processor 204, the processor 1004, or the module 1102. The means for indentifying may comprise an application specific integrated circuit, e.g., the processor 204, the processor 1004, or the module 1102. The means for selecting may comprise an application specific integrated circuit, e.g., the processor 204, the processor 1004, or the module 1102. The means for replacing may comprise an application specific integrated circuit, e.g., the processor 204, the processor 1004, or the module 1104. The means for performing may comprise an application specific integrated circuit, e.g., the processor 204, the processor 1004, or the module 1108. The means for determining may comprise an application specific integrated circuit, e.g., the processor 204, the processor 1004, the module 1108, or the module 1304 from FIG. 13. The means for filtering may comprise a filter, e.g., the processor 204, or the processor 1004. The means for receiving may comprise a receiver, e.g., the receiver 212 of the wireless device 202 from FIG. 2, the user interface 1012 from FIG. 10, or the module 1302 from FIG. 13. The means for reconstructing may comprise an application specific integrated circuit, e.g., the processor 204, the processor 1004, or the module 1304. The means for combining may comprise an application specific integrated circuit, e.g., the processor 204, the processor 1004, or the module 1304.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

A wireless device in the present disclosure may include various components that perform functions based on signals that are transmitted by or received at the wireless device. A wireless device may also refer to a wearable wireless device. In some aspects the wearable wireless device may comprise a wireless headset or a wireless watch. For example, a wireless headset may include a transducer adapted to provide audio output based on data received via a receiver. A wireless watch may include a user interface adapted to provide an indication based on data received via a receiver. A wireless sensing device may include a sensor adapted to provide data to be transmitted via a transmitter.

A wireless device may communicate via one or more wireless communication links that are based on or otherwise support any suitable wireless communication technology. For example, in some aspects a wireless device may associate with a network. In some aspects the network may comprise a personal area network (e.g., supporting a wireless coverage area on the order of 30 meters) or a body area network (e.g., supporting a wireless coverage area on the order of 10 meters) implemented using ultra-wideband technology or some other suitable technology. In some aspects the network may comprise a local area network or a wide area network. A wireless device may support or otherwise use one or more of a variety of wireless communication technologies, protocols, or standards such as, for example, CDMA, TDMA, OFDM, OFDMA, WiMAX, and Wi-Fi. Similarly, a wireless device may support or otherwise use one or more of a variety of corresponding modulation or multiplexing schemes. A wireless device may thus include appropriate components (e.g., air interfaces) to establish and communicate via one or more wireless communication links using the above or other wireless communication technologies. For example, a device may comprise a wireless transceiver with associated transmitter and receiver components (e.g., transmitter 210 and receiver 212) that may include various components (e.g., signal generators and signal processors) that facilitate communication over a wireless medium.

The teachings herein may be incorporated into (e.g., implemented within or performed by) a variety of apparatuses (e.g., devices). For example, one or more aspects taught herein may be incorporated into a phone (e.g., a cellular phone), a personal data assistant ("PDA") or so-called smart-phone, an entertainment device (e.g., a portable media device, including music and video players), a headset (e.g., headphones, an earpiece, etc.), a microphone, a medical sensing device (e.g., a biometric sensor, a heart rate monitor, a pedometer, an EKG device, a smart bandage, etc.), a user I/O device (e.g., a watch, a remote control, a light switch, a keyboard, a mouse, etc.), an environment sensing device (e.g., a tire pressure monitor), a monitoring device that may receive data from the medical or environment sensing device (e.g., a desktop, a mobile computer, etc.), a point-of-care device, a hearing aid, a set-top box, or any other suitable device. The monitoring device may also have access to data from different sensing devices via connection with a network.

These devices may have different power and data requirements. In some aspects, the teachings herein may be adapted for use in low power applications (e.g., through the use of an impulse-based signaling scheme and low duty cycle modes) and may support a variety of data rates including relatively high data rates (e.g., through the use of high-bandwidth pulses).

In some aspects a wireless device may comprise an access device (e.g., an access point) for a communication system. Such an access device may provide, for example, connectivity to another network (e.g., a wide area network such as the Internet or a cellular network) via a wired or wireless communication link. Accordingly, the access device may enable another device (e.g., a wireless station) to access the other network or some other functionality. In addition, it should be appreciated that one or both of the devices may be portable or, in some cases, relatively non-portable. Also, it should be appreciated that a wireless device also may be capable of transmitting and/or receiving information in a non-wireless manner (e.g., via a wired connection) via an appropriate communication interface.

While the foregoing is directed to aspects of the present disclosure, other and further aspects of the disclosure may be devised without departing from the basic scope thereof, and the scope thereof is determined by the claims that follow.

The invention claimed is:

1. An apparatus for communication, comprising:
   a first circuit configured to detect one or more transient segments of a biomedical signal, wherein the first circuit is also configured to apply a second-order differential on the biomedical signal to detect the one or more transient segments;
   a second circuit configured to estimate a residual segment of the biomedical signal based on the one or more transient segments;
   a first encoder configured to encode the one or more transient segments;

a second encoder configured to encode the residual segment; and a transmitter configured to transmit the one or more encoded transient segments and the encoded residual segment.

2. The apparatus of claim 1, wherein the first circuit is also configured to:

identify at least one sample of the biomedical signal having a value of the second-order differential larger than a threshold; and select a window of samples of the biomedical signal around each of the at least one sample to detect the one or more transient segments.

3. The apparatus of claim 1, wherein the first encoder is also configured to encode the transient segments by encoding segments of the biomedical signal being sparse in time domain.

4. The apparatus of claim 3, wherein encoding the segments of the biomedical signal being sparse in time domain comprises sensing inflection points of the biomedical signal.

5. The apparatus of claim 1, wherein the second circuit is also configured to:

replace, in the biomedical signal, samples of the transient segments with values to estimate the residual segment.

6. The apparatus of claim 5, wherein the values comprise all zeros.

7. The apparatus of claim 5, wherein the values are defined to form one or more smooth segments replacing the one or more transient segments.

8. The apparatus of claim 1, wherein the second encoder is also configured to:

perform, in time domain, random sampling of the residual segment to encode the residual segment.

9. The apparatus of claim 1, wherein the second encoder is also configured to:

determine whether the residual segment comprises a low-pass signal; and perform decimation on the residual segment, if the residual segment comprises the low-pass signal.

10. The apparatus of claim 9, further comprising:

a finite impulse response (FIR) filter configured to filter the residual segment prior to the decimation.

11. The apparatus of claim 1, wherein the second encoder is also configured to:

determine whether the residual segment comprises a low-pass signal; and perform random sampling of the residual segment, if the residual segment does not comprise the low-pass signal.

12. A method for communication, comprising:

detecting one or more transient segments of a biomedical signal by at least applying a second-order differential on the biomedical signal to detect the one or more transient segments;

estimating a residual segment of the biomedical signal based on the one or more transient segments;

encoding the one or more transient segments;

encoding the residual segment; and transmitting the one or more encoded transient segments and the encoded residual segment.

13. The method of claim 12, further comprising:

identifying at least one sample of the biomedical signal having a value of the second-order differential larger than a threshold; and selecting a window of samples of the biomedical signal around each of the at least one sample to detect the one or more transient segments.

14. The method of claim 12, wherein encoding the transient segments comprises:

encoding segments of the biomedical signal being sparse in time domain.

15. The method of claim 14, wherein encoding the segments of the biomedical signal being sparse in time domain comprises sensing inflection points of the biomedical signal.

16. The method of claim 12, further comprising:

replacing, in the biomedical signal, samples of the transient segments with values to estimate the residual segment.

17. The method of claim 16, wherein the values comprise all zeros.

18. The method of claim 16, wherein the values are defined to form one or more smooth segments replacing the one or more transient segments.

19. The method of claim 12, wherein encoding the residual segment comprises:

performing, in time domain, random sampling of the residual segment.

20. The method of claim 12, wherein encoding the residual segment comprises:

determining whether the residual segment comprises a low-pass signal; and performing decimation on the residual segment, if the residual segment comprises the low-pass signal.

21. The method of claim 20, further comprising:

finite impulse response (FIR) filtering of the residual segment prior to the decimation.

22. The method of claim 12, wherein encoding the residual segment comprises:

determining whether the residual segment comprises a low-pass signal; and performing random sampling of the residual segment, if the residual segment does not comprise the low-pass signal.

23. An apparatus for communication, comprising:

means for detecting one or more transient segments of a biomedical signal, said detecting means comprising means for applying a second-order differential on the biomedical signal to detect the one or more transient segments;

means for estimating a residual segment of the biomedical signal based on the one or more transient segments;

means for encoding the one or more transient segments;

means for encoding the residual segment; and means for transmitting the one or more encoded transient segments and the encoded residual segment.

24. The apparatus of claim 23, further comprising:

means for identifying at least one sample of the biomedical signal having a value of the second-order differential larger than a threshold; and means for selecting a window of samples of the biomedical signal around each of the at least one sample to detect the one or more transient segments.

25. The apparatus of claim 23, wherein the means for encoding the transient segments comprises:

means for encoding segments of the biomedical signal being sparse in time domain.

26. The apparatus of claim 25, wherein the means for encoding the segments of the biomedical signal being sparse in time domain comprises:

means for sensing inflection points of the biomedical signal.

27. The apparatus of claim 23, further comprising:

means for replacing, in the biomedical signal, samples of the transient segments with values to estimate the residual segment.

28. The apparatus of claim 27, wherein the values comprise all zeros.

29. The apparatus of claim 27, wherein the values are defined to form one or more smooth segments replacing the one or more transient segments.

30. The apparatus of claim 23, wherein the means for encoding the residual segment comprises:
   means for performing, in time domain, random sampling of the residual segment.

31. The apparatus of claim 23, wherein the means for encoding the residual segment comprises:
   means for determining whether the residual segment comprises a low-pass signal; and
   means for performing decimation on the residual segment, if the residual segment comprises the low-pass signal.

32. The apparatus of claim 31, further comprising:
   means for finite impulse response (FIR) filtering of the residual segment prior to the decimation.

33. The apparatus of claim 23, wherein the means for encoding the residual segment comprises:
   means for determining whether the residual segment comprises a low-pass signal; and
   means for performing random sampling of the residual segment, if the residual segment does not comprise the low-pass signal.

34. A computer-program product for communication, comprising a non-transitory computer-readable medium comprising instructions executable to:
   detect one or more transient segments of a biomedical signal by at least applying a second-order differential on the biomedical signal to detect the one or more transient segments;
   estimate a residual segment of the biomedical signal based on the one or more transient segments;
   encode the one or more transient segments;
   encode the residual segment; and
   transmit the one or more encoded transient segments and the encoded residual segment.

35. A sensing device, comprising:
   a sensor configured to sense a biomedical signal;
   a first circuit configured to detect one or more transient segments of the biomedical signal, wherein the first circuit is also configured to apply a second-order differential on the biomedical signal to detect the one or more transient segments;
   a second circuit configured to estimate a residual segment of the biomedical signal based on the one or more transient segments;
   a first encoder configured to encode the one or more transient segments;
   a second encoder configured to encode the residual segment; and
   a transmitter configured to transmit the one or more encoded transient segments and the encoded residual segment.

* * * * *